US012618891B2

(12) United States Patent
Pizzi et al.

(10) Patent No.: US 12,618,891 B2
(45) Date of Patent: May 5, 2026

(54) SENSOR DEVICE FOR MONITORING THE DIELECTRIC STRENGTH OF A DIELECTRIC FLUID, IN PARTICULAR A FLUID FOR THE THERMAL CONDITIONING OF A BATTERY

(71) Applicant: ELTEK S.p.A., Casale Monferrato (IT)

(72) Inventors: Marco Pizzi, Casale Monferrato (IT); Paolo Begnamino, Casale Monferrato (IT); Marco Ferragatta, Casale Monferrato (IT); Matteo Rondano, Casale Monferrato (IT); Mauro Zorzetto, Casale Monferrato (IT)

(73) Assignee: ELTEK S.p.A., Casale Monferrato (IT)

( * ) Notice: Subject to any disclaimer, the term of this patent is extended or adjusted under 35 U.S.C. 154(b) by 200 days.

(21) Appl. No.: 18/682,090

(22) PCT Filed: May 27, 2022

(86) PCT No.: PCT/IB2022/055005
§ 371 (c)(1),
(2) Date: Feb. 7, 2024

(87) PCT Pub. No.: WO2022/254298
PCT Pub. Date: Dec. 8, 2022

(65) Prior Publication Data
US 2024/0230747 A1 Jul. 11, 2024

(30) Foreign Application Priority Data
Jun. 1, 2021 (IT) ........................ 102021000014312

(51) Int. Cl.
*G01R 27/26* (2006.01)
*G01R 31/12* (2020.01)
(Continued)

(52) U.S. Cl.
CPC ..... *G01R 31/1281* (2013.01); *G01R 27/2652* (2013.01); *G01R 31/14* (2013.01); *G01R 31/16* (2013.01)

(58) Field of Classification Search
CPC ............... G01R 27/22; G01R 27/2617; G01R 27/2647; G01R 27/2652; G01R 31/14;
(Continued)

(56) References Cited

U.S. PATENT DOCUMENTS 3,996,512 A 12/1976 Baur
5,068,617 A * 11/1991 Reich ................... G01N 27/226
324/687

(Continued)

FOREIGN PATENT DOCUMENTS

GB 2096774 A 10/1982
JP 2012042290 * 3/2012

OTHER PUBLICATIONS

International Search Report and Written Opinion of the ISA for PCT/IB2022/055005 mailed Sep. 30, 2022, 13 pages.

*Primary Examiner* — Thang X Le
(74) *Attorney, Agent, or Firm* — Nixon & Vanderhye P.C.; Lars H. Genieser

(57) ABSTRACT

A sensor device for monitoring dielectric strength of a dielectric fluid has a sensor body which supports a sensitive part (SGi), designed for contact with the dielectric fluid. The sensitive part (SGi) comprises at least one pair of electrodes (E1, E2) having respective surface portions arranged at a predefined micrometric or sub-micrometric distance, to define therebetween at least one detection gap between which part of the dielectric fluid is suitable to seep in. The sensor device has a circuit arrangement comprising:
—means for generating an electric field between the two electrodes of the at least one pair of electrodes (E1, E2) starting from a known supply voltage, and—means (V) for
(Continued)

measuring a voltage representative of possible occurrence of an electric discharge between the two electrodes of the at least one pair of electrodes (E1, E2) through the dielectric fluid (5) present in the at least one detection gap (G), following generation of the electric field.

18 Claims, 15 Drawing Sheets

(51) Int. Cl.
*G01R 31/14* (2006.01)
*G01R 31/16* (2006.01)

(58) Field of Classification Search
CPC ............... G01R 31/16; G01R 31/1263; G01R 31/1281; Y02E 60/10
See application file for complete search history.

(56) References Cited

U.S. PATENT DOCUMENTS

| | | | | |
|---|---|---|---|---|
| 5,591,896 A | * | 1/1997 | Lin | G01T 1/185 |
| | | | | 324/459 |
| 6,781,388 B2 | | 8/2004 | Wang | |
| 8,461,853 B2 | * | 6/2013 | Clark | G01R 31/16 |
| | | | | 324/693 |
| 2007/0227880 A1 | * | 10/2007 | Muhr | G01R 31/1281 |
| | | | | 204/242 |
| 2010/0188111 A1 | | 7/2010 | Fougere | |
| 2013/0233707 A1 | * | 9/2013 | Kato | G01N 27/27 |
| | | | | 204/406 |
| 2018/0003663 A1 | * | 1/2018 | Kameshiro | G01N 33/5438 |
| 2019/0128726 A1 | * | 5/2019 | Zorzetto | G01F 23/268 |
| 2020/0173958 A1 | * | 6/2020 | Chiang | G01N 33/5438 |
| 2021/0333229 A1 | * | 10/2021 | King | G01N 27/06 |

* cited by examiner

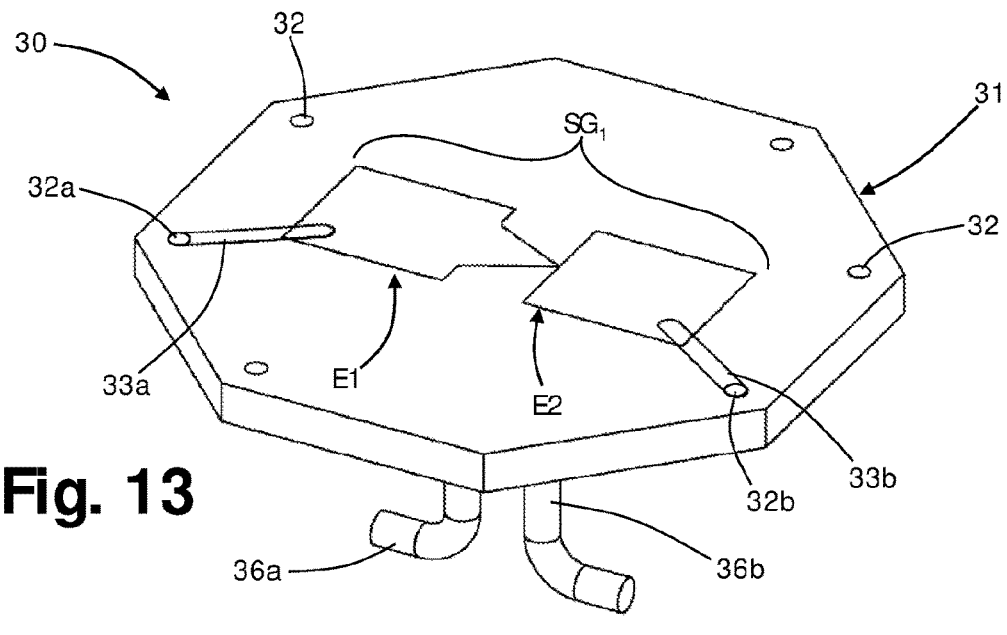
Fig. 13
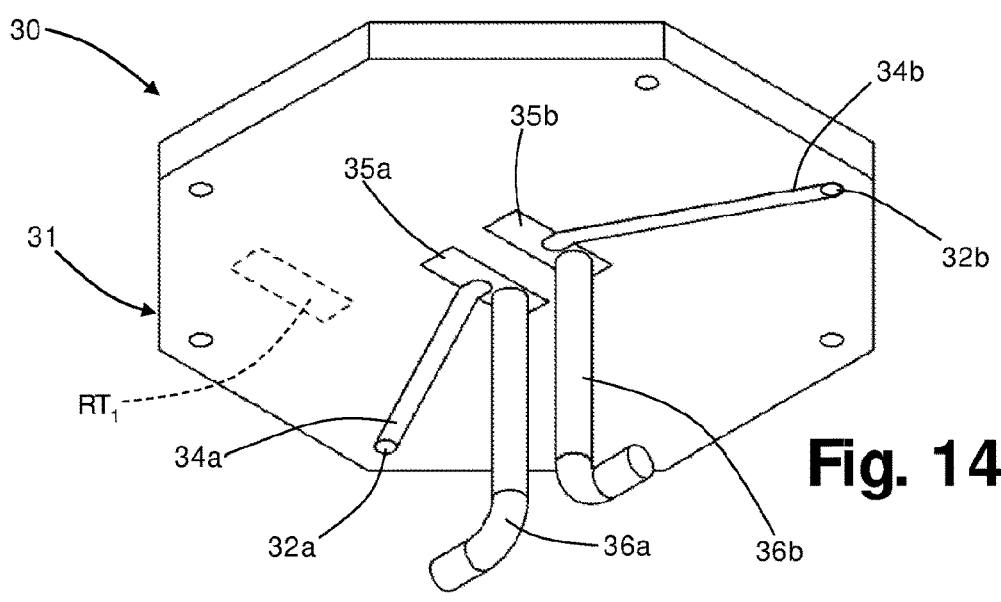
Fig. 14
Fig. 15
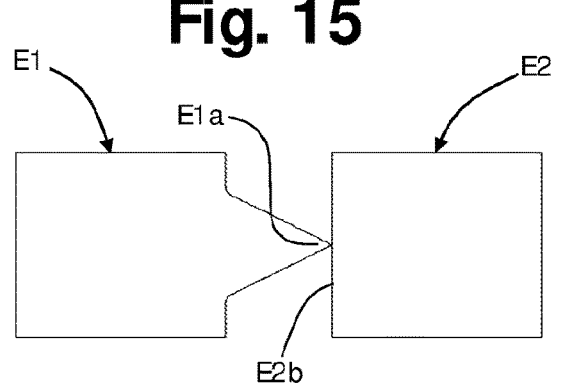
Fig. 16
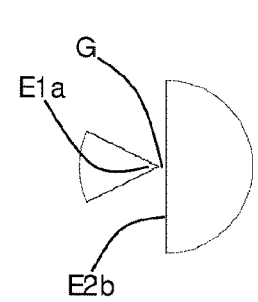

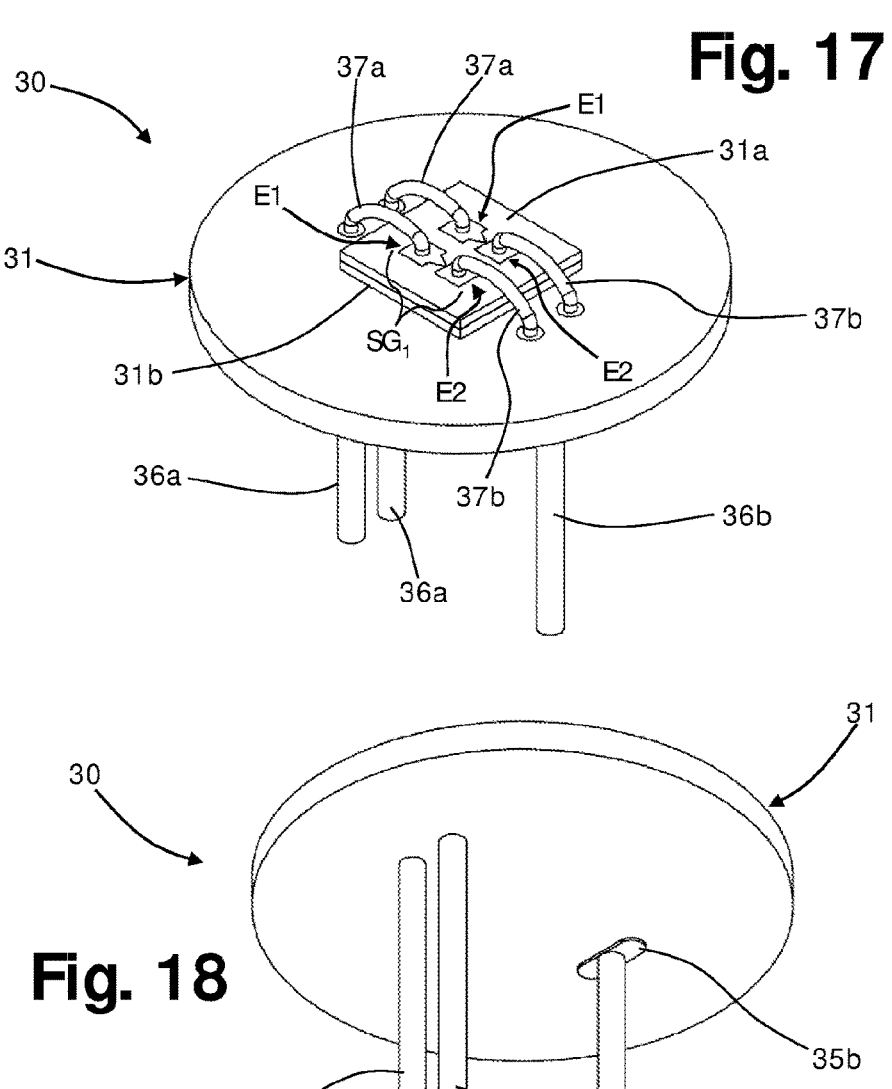
Fig. 17
Fig. 18
Fig. 19
Fig. 20
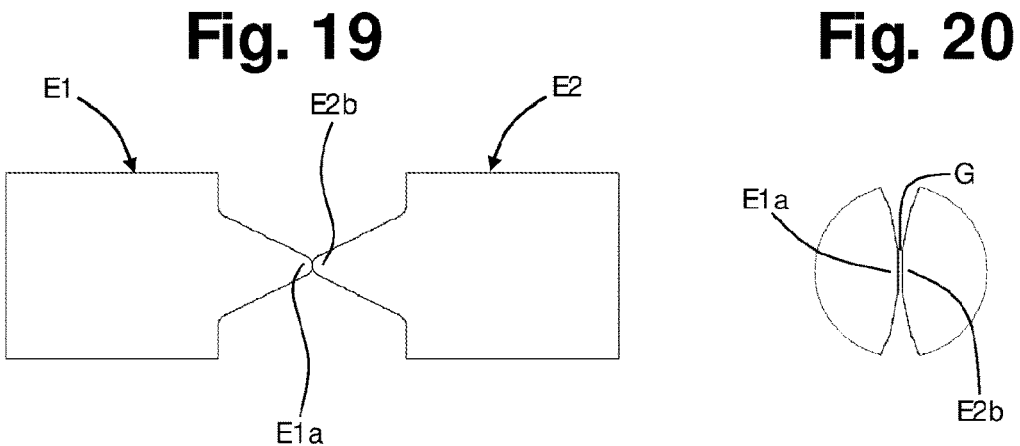

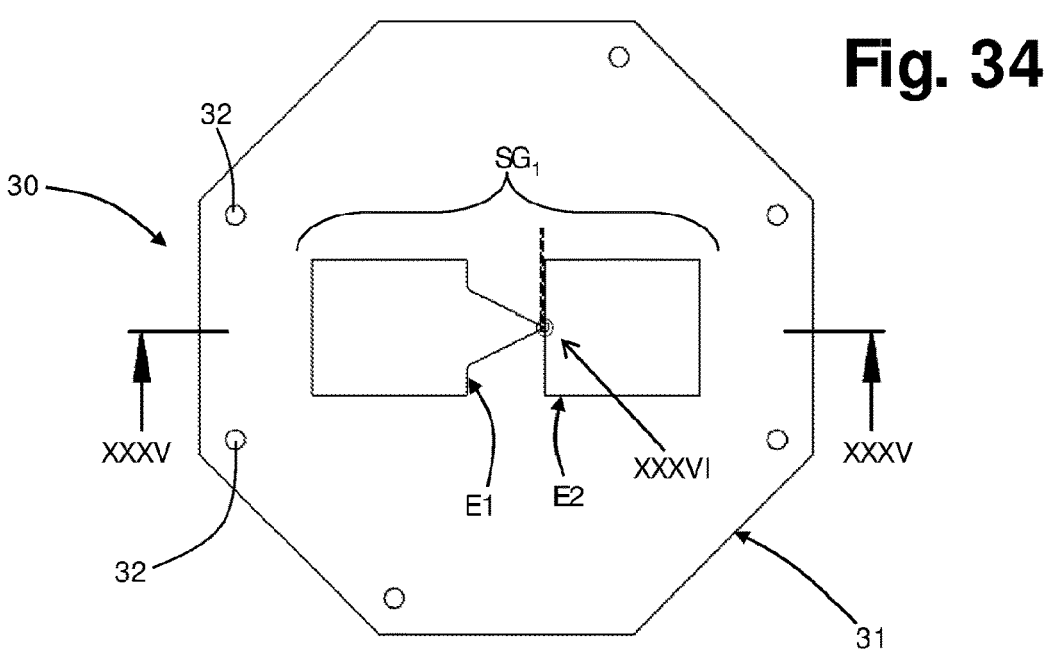
Fig. 34
Fig. 35
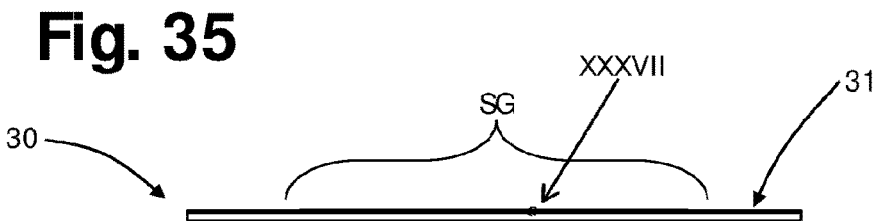
Fig. 36
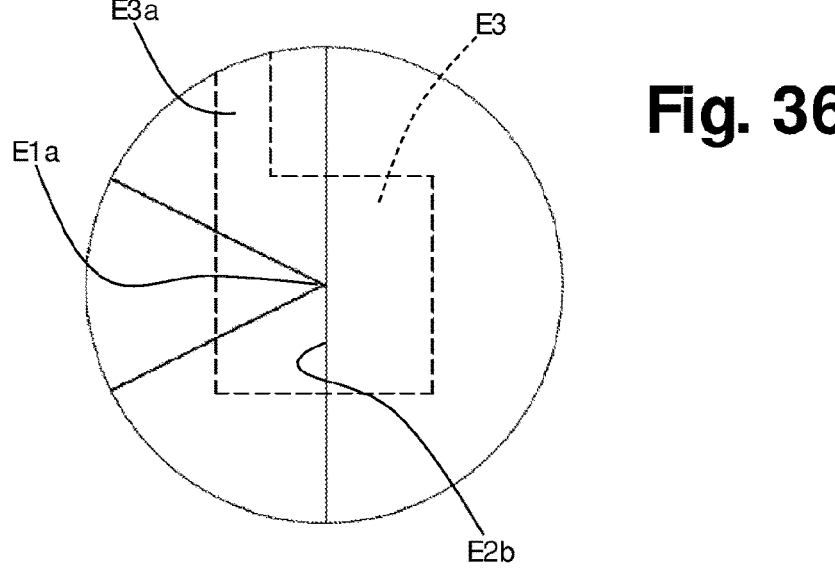

SENSOR DEVICE FOR MONITORING THE DIELECTRIC STRENGTH OF A DIELECTRIC FLUID, IN PARTICULAR A FLUID FOR THE THERMAL CONDITIONING OF A BATTERY

This application is the U.S. national phase of International Application No. PCT/IB2022/055005 filed May 27, 2022 which designated the U.S. and claims priority to IT 102021000014312 filed Jun. 1, 2021, the entire contents of each of which are hereby incorporated by reference.

FIELD OF INVENTION

The present invention refers in general to sensor devices intended for monitoring one or more electrical quantities of a fluid, and to electrical devices equipped with a sensor of the type indicated. The invention has been developed with particular attention being paid to the monitoring of the dielectric strength of a dielectric fluid, preferably a fluid present in a casing of an electrical device, such as a fluid for the thermal conditioning of a battery. The described sensor device is however also suitable for use in other areas, or in combination with electrical devices other than a battery.

BACKGROUND ART

In recent times, the need of temperature conditioning of batteries in a more and more efficient manner, for example batteries that equip vehicles, is emerging. The technical solution adopted in some cases is to directly cool the battery cells by immersing them in a dielectric fluid, in order to maximize the heat exchange efficiency. The disadvantage of this solution is that, if the fluid used in contact with the battery cells does not guarantee a sufficient insulation, currents can be established inside the battery pack with significant loss of efficiency, up to potentially very dangerous outcomes.

In order to keep under control the electrical insulation characteristics of the cooling fluid in which the battery cells are directly immersed, solutions based on the measurement of electrical parameters, such as measurements of dielectric constant, impedance, conductivity, have been proposed. However, these measurements have only an indirect correlation with the quantity of actual interest represented by the dielectric strength, i.e. the limit value of the electric field beyond which a conduction of electricity is produced through the fluid in question.

In general, a fluid used for the thermal conditioning of a battery should ensure a minimum dielectric strength of not less than values of the order of 3 kV/mm. According to the current state of the art, the direct measurement of these dielectric strength values would require detection elements of macroscopic dimensions and based on the use of voltages being very high and expensive to generate, and which potentially behave as sources of electromagnetic noise and are dangerous for the possible triggering of avalanche phenomena on relatively large regions of space. On the other hand, the measurement of the electrical conductivity of the fluid alone does not always allow to accurately discriminate potentially dangerous situations.

For these reasons, the approach generally followed is therefore to proceed with measurements of several different electrical quantities, such as the aforementioned dielectric constant, impedance and conductivity, correlating them with each other, with results that are not always satisfactory.

Similar problems are also found in applications other than the exemplified one, wherein a dielectric fluid is used in combination with a generic electrical device, for example for its thermal conditioning.

AIM AND SUMMARY OF THE INVENTION

The present invention is based on the consideration of the fact that, particularly when the safety of an electrical device, such as a battery, is at stake, it would be desirable to have a sensor device that does not rely only on indirect measurements, or on complex correlations of indirect parameters and based on case systems that are hardly exhaustive.

In this context, an aim of the present invention is essentially to obtain a sensor device capable of monitoring the degree of electrical insulation guaranteed by a fluid, in particular a thermal conditioning fluid of an electrical device, such as a battery.

Another aim of the invention is to obtain a sensor device operating at a low voltage, but able to monitor also a high electrical resistance and/or a high electrical insulation of a fluid.

Another aim of the invention is to obtain a sensor device capable of monitoring the electrical insulation of fluid, being of compact construction.

An auxiliary aim of the invention is to obtain a sensor device that can be conveniently used even in cases where it is necessary to measure the degree of electrical insulation of substances with very low conductivity.

One or more of the above aims, and other aims that will become clearer later, are achieved according to the present invention by a sensor device as described below. The aims of the invention are also achieved by an electrical device comprising such a sensor device. Preferential embodiments of the invention are indicated in the attached claims. The claims form an integral part of the technical teaching provided herein in relation to the invention.

According to the invention, a sensor device is proposed for the direct monitoring of the dielectric strength, having a miniaturized sensitive part for detection, or in any case obtained in such a way as to include at least one pair of detection electrodes arranged at micrometric or sub-micrometric or nanometric distances, to generate high electric fields even starting from low voltages, where in particular the electrodes are on one and same support, in fixed positions. In general, the sensitive part of a sensor device according to the invention includes at least two electrodes, preferably microelectrodes, placed at a distance comprised between 100 nanometers and 20 micrometers, in order to define therebetween a measurement discontinuity or gap suitable for generating electric fields of several kV/m at low voltages, approximately comprised between 1 and 30 V, preferably between 3 and 10 V.

The detection can be carried out using direct voltages, alternating voltages with various frequencies, pulsed or of various shapes.

In various preferential embodiments, a direct voltage is used, by means of suitable electrical or electronic circuit means, to charge a capacitor having a known or predefined capacitance, which is then discharged on the measurement gap, i.e., in order to generate an electric field between the two electrodes. The sensor device can eventually be prearranged with an electronic driving circuit that reverses the polarity between the electrodes at each measurement cycle, as will be described in detail below. A possible scheme of operation of a sensor device according to possible embodiments of the invention therefore provides that the capacitor of known capacitance is brought to a certain voltage, then disconnected from the power supply and then connected to the sensitive part of the sensor device: by monitoring the voltage at the ends of the capacitor, after connection thereof to the measurement gap of the sensitive part immersed in the fluid, it is possible to obtain representative information of the value of dielectric strength of the fluid itself, that is, of its degree of electrical insulation. A highly insulating fluid will cause a virtually infinite time constant, while the discharge of the capacitor will become quicker due to the conduction of the fluid. An insulating fluid, such as ultrapure water, will show good insulation at low electric fields, while it will become more conductive at high electric fields: it is precisely for these types of dielectric fluids that the sensor device according to the invention allows to discriminate situations which are not measurable via conductivity measurements only.

According to other embodiments of the invention, the sensor device is independent of the use of a capacitor and its operation is of a resistive type, or based on the measurement of an equivalent resistance.

The sensitive part of a sensor device according to the invention may possibly include several pairs of electrodes arranged at different micrometric or sub-micrometric or nanometric distances on one and the same support, for example with the respective electrodes at 2, 4, 8, 16 micrometers from each other, and supplied independently and sequentially, or simultaneously, with a low voltage, for example a voltage of 16 V. If the time constant stays above a certain threshold value for all the provided electrode pairs, it will be possible to conclude that the dielectric strength of the fluid is higher, for example, than 8 kV/mm; if, on the other hand, an electric discharge is detected, at the smallest measurement gap (2 micrometers, in the example cited), which is significantly faster than those that occur at the other measurement gaps, it will be possible to conclude that the dielectric strength of the fluid is included, for example, between 4 and 8 kV/mm, and so on.

Of course, the given exemplification applies in principle, and the sensor device according to the invention will have to be calibrated according to the type of fluid subject to measurement, also in relation to the shape of the used electrodes.

In various preferential embodiments, the electrodes of the sensitive part are obtained in the form of a thin film. The part at a shortest distance between the electrodes, which defines the measurement gap, may have relatively small radii of curvature, of the order of microns or less, for example comprised between 10 and 500 nm: such electrodes have a marked "tip effect", with consequent lowering of the voltage required to obtain a partial electric discharge or a breakdown voltage, which circumstance is advantageous for the purpose of reducing the electrical voltage used for the measurements. In the case of fluids, the term "breakdown voltage" has to be understood in a dynamical way, since—given that the volume of fluid involved in the discharge is very limited and subject to continuous mixing either for local thermal motions, convective or for possible macroscopic flows—if the measurement is repeated several times the result is in principle always the same, unlike a solid dielectric in which said mixing does not occur and the dielectric changes characteristics with each discharge.

The use of thin film techniques allows to achieve the precision necessary to obtain microelectrodes, or in any case of measurement gaps of micrometric or sub-micrometric or nanometric dimensions. In various embodiments the thickness of the metal films that form or compose the electrodes is comprised between 50 nanometers and 2 micrometers, preferably between 100 and 500 nanometers. Preferably, the electrodes are composed of at least two layers, such as a first layer being 20-80 nanometers thick, in titanium or chromium, with the function of adhesion promoter, and a second layer in platinum, copper, nickel or other conductor, typically being some hundred nanometers thick. In accordance with other embodiments, however, electrodes formed with a single metal, preferably chromium or titanium, can be used.

The electrodes are preferably deposited on one and the same electrically insulating support, for example made of ceramic (such as alumina or zirconia) or plastic material. In other embodiments, the electrodes can be deposited on one and the same substrate formed with silicon oxide obtained on a silicon wafer (preferably by oxidation), the substrate having preferably a thickness which is not less than the distance between the electrodes at the measurement gap (or the smaller measurement gap, in the case of several pairs of electrodes), but preferably greater than this distance, in order to avoid an electric discharge inside the silicon substrate.

Preferred techniques for obtaining the electrodes are thermal evaporation in high vacuum and sputtering. Other techniques can also be used, such as CVD (Chemical Vdpor Deposition) or ALD (Atomic Layer Deposition). In the event that it is necessary to obtain very small gaps, of the order of tens or hundreds of nanometers, without using expensive lithography techniques at nanoscale, it is possible to obtain the micrometric gaps using classical lithographic techniques and subsequently reduce them by isotropic galvanic growth. In general, regardless of the deposition technique used, the definition of the electrodes will be obtained by photolithographic techniques such as photoresist deposition, UV exposure, development and subsequent chemical attack of the metal or metals, removal of the photoresist.

BRIEF DESCRIPTION OF THE DRAWINGS

Further aims, characteristics and advantages of the invention will be clear from the detailed description which follows, made with reference to the attached schematic drawings, provided purely by way of non-limiting example, wherein:

FIGS. 13 and 14 are schematic perspective views, from different angles, of a sensitive part of a sensor device in accordance with possible embodiments;

FIGS. 15 and 16 are a schematic representation and a corresponding enlarged detail, respectively, of a pair of electrodes of a sensitive part of a sensor device according to possible embodiments;

FIGS. 17 and 18 are schematic perspective views, from different angles, of a sensitive part of a sensor device in accordance with other possible embodiments;

FIGS. 19-20, 21-22, 23-24 are schematic representations similar to those of FIGS. 15-16, respectively, of possible alternative embodiments of electrode pairs;

FIG. 34 is a schematic view from above of a sensitive part of a sensor device according to possible embodiments;

FIG. 35 is a schematic section according to line XXXV-XXXV of FIG. 34;

FIG. 36 is an enlarged view of the detail XXXVI of FIG. 34;

DESCRIPTION OF PREFERRED EMBODIMENTS

Figures 1, 2:
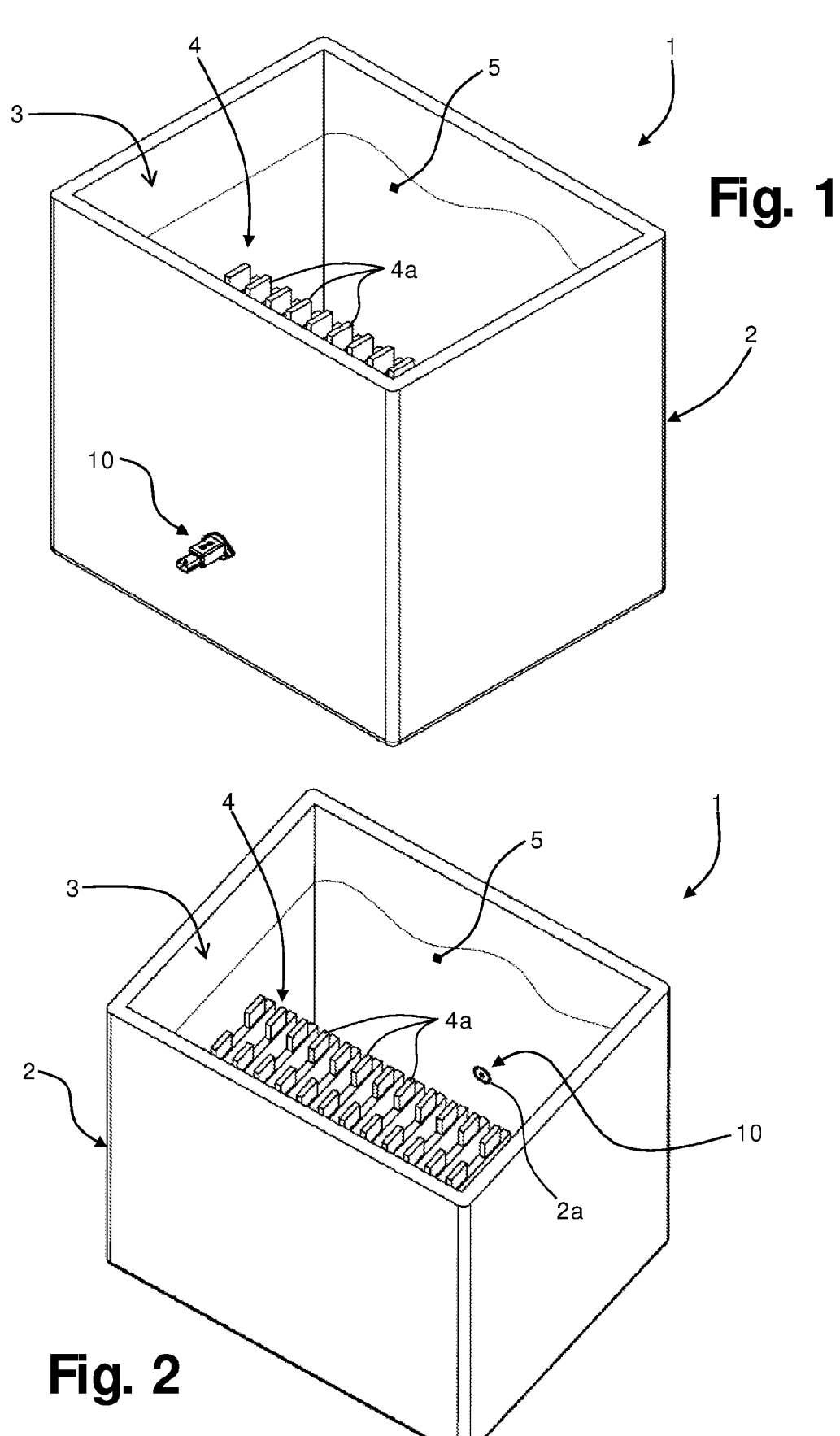
FIGS. 1 and 2 are schematic perspective views from different angles of an electrical device equipped with a sensor device according to possible embodiments.

Reference to an embodiment within this description indicates that a particular configuration, structure, or characteristic described in relation to the embodiment is included in at least one embodiment. Thus, phrases such as "in one embodiment", "in various embodiments" and the like, possibly present in different places of this description, are not necessarily referred to one and the same embodiment. In addition, particular conformations, structures or characteristics defined within this description may be combined in any appropriate way in one or more embodiments, even different from those depicted. The numerical and spatial references (such as "upper", "lower", "top", "bottom", etc.) as used herein are for convenience only and therefore do not define the scope of protection or the scope of the embodiments. The same reference numbers are used in the figures to indicate similar or technically equivalent elements.

In FIGS. 1-4 a generic electrical device is represented in a schematic form, in combination with which a dielectric fluid is used, for example for thermal conditioning purposes, and equipped with a sensor device according to possible embodiments of the invention. In the example the device shown is a battery, having a battery pack cooled by a dielectric liquid: as mentioned, however, the scope of the invention is not limited to this specific technical field.

The device or battery, indicated as a whole with 1, has a casing 2 that defines a containment volume 3, inside which an electrical part is arranged, here represented a battery pack 4, comprising a plurality of batteries or electrolytic cells 4a, connected in series or in parallel. The volume 3 is suitable for receiving a dielectric fluid 5 for the thermal conditioning of the battery pack 4, in particular a coolant. In the following, let us assume that the fluid 5 is a hydrofluoroether (HFE), for example a fluid belonging to the NOVEC™ family, produced by 3M Company, St. Paul, Minnesota, USA, or else 1,1,1,2,2,3,3-Heptafluoro-3-methoxypropane (formula: C4H3F7O—CAS Registry Number: 375-03-1).

The practical realization of a possible fluidic circuit and/or of other components of a cooling system for fluid 5 is independent of the purposes of this description.

One of the walls of the casing 2, in particular a side wall thereof, is equipped with a through opening 2a, at which a sensor device in accordance with the invention is installed, indicated as a whole with 10, and later also identified as a "sensor", for brevity. The opening 2a is preferably located at a height corresponding to a condition of immersion of at least a sensitive end of the sensor into the fluid, in particular in a condition of at least partial immersion of the pack 4 in the fluid 5: in this perspective, device 10 could possibly also be used as a sensor of minimum level, as mentioned below, in the case of fluids having an electrical insulation distinguishable from that of the air.

As can also be seen in the detail of FIG. 4, the sensor 10 is mounted in a watertight way at the aforementioned opening 2a and is configured in such a way that the fluid 5 can come into contact with a sensitive part of the sensor itself, as explained below. More generally, the sensor has a sensor body configured for mounting on the electrical device or battery so that a sensitive part thereof is in contact or immersed in the fluid subject to monitoring. Of course, the mounting position of the sensor 10 shown in the drawings must be understood as a mere example, as the same sensor could be installed in another position, provided that its sensitive part is able to be reached by the fluid 5 (for example along a circuit for the supply and/or the recirculation of the fluid 5 in the volume 3).

A sensor 10 according to possible embodiments is shown with different views in FIGS. 5-12.

Figure 5:
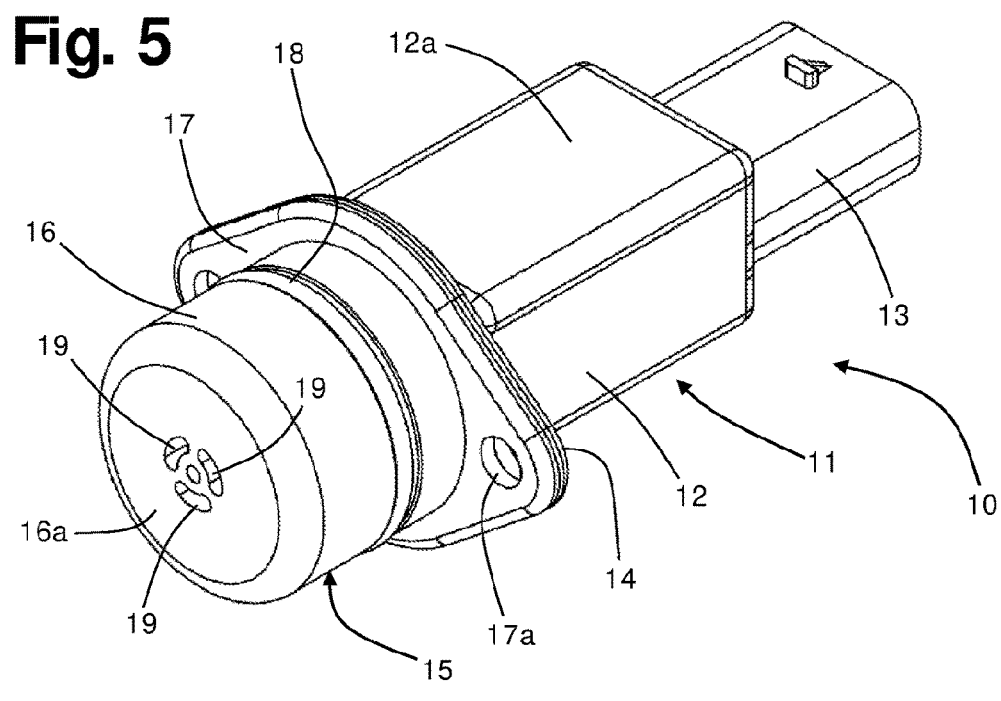
FIGS. 5, 6, 7, 8 and 9 are schematic views, respectively in perspective, in plan from above, in side elevation, in rear elevation and in front elevation, of a sensor device according to possible embodiments of the invention.
Figure 6:
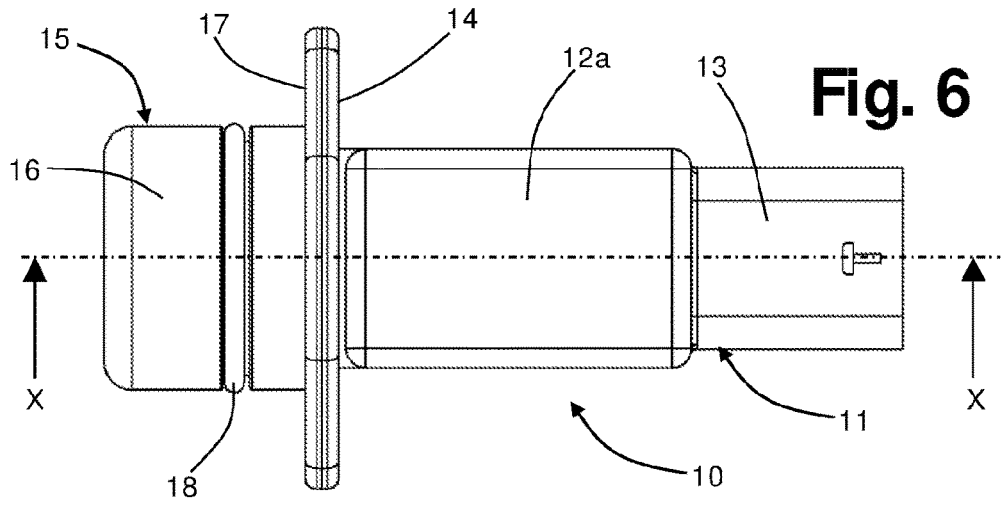
Figure 7:
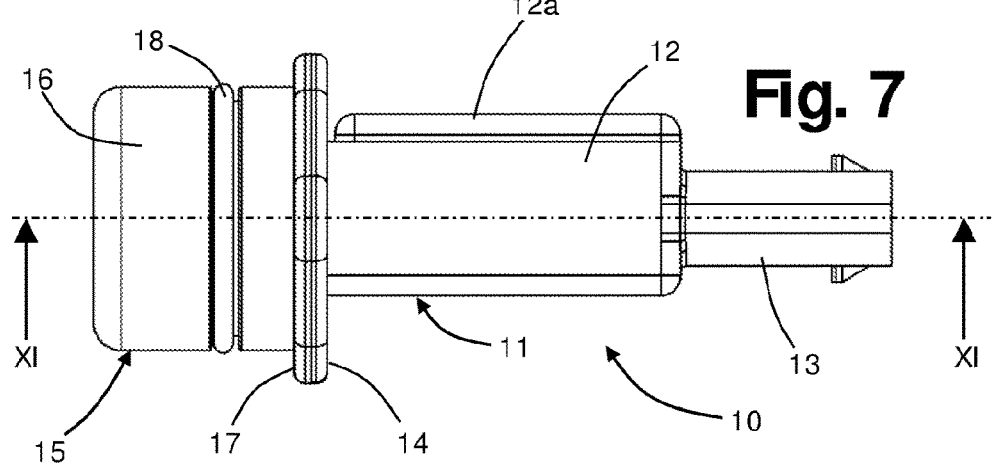

Referring initially to FIGS. 5-7, the sensor 10 has a first body part 11, formed for example with an electrically insulating plastic material. In various embodiments, body part 11 extends longitudinally and has a box-like portion 12, provided with a cover 12a, and preferably a first tubular portion 13, which obtains an electrical connector body. In various embodiments, the body 11 defines an intermediate flange 14, radially protruding, provided with holes 14a (FIG. 8) for receiving suitable fixing elements, such as screws. Alternatively, the sensor 10 could be equipped with another type of fixing and/or positioning means, such as means for quick coupling, possibly complementary to respective coupling and/or positioning means provided on the casing 2 of the electrical device or battery 1.

Sensor 10 preferably comprises a second body part 15, also formed for example in with an electrically insulating plastic material. Body part 15 defines a hollow portion 16, substantially cup-shaped, and—preferably—a respective radially protruding end flange 17, also provided with holes 17a (FIG. 9) for fixing means. When both present, flanges 14 and 17 can have approximately the same profile and the same arrangement of the corresponding holes 14a and 17a, such that, in the assembled condition, the holes 14a are in a position substantially coinciding with that of the holes 17a: in the assembled condition, the two flanges 14 and 17 can therefore abuts against each other, to form the body of the sensor 10. The flanges 14 and 17 can be joined together, for example by welding or gluing, or else the reciprocal fastening can be achieved by using the same fixing elements, such as the aforementioned screws, used to fix the sensor 10 in place.

In various embodiments, the sensor 10 may comprise elements to uniquely define the assembly position between the body parts 11 and 15, such as for example a positioning element on part 11 and a corresponding positioning counter-element on part 15. In the example shown, these element and counter-element are at the facing sides of the two flanges 14 and 17 (see in particular the element indicated with 17*b* in FIG. 12, protruding axially from the flange 17, to which there corresponds a respective seat or recess on the flange 14*a*, not visible).

Figure 12:
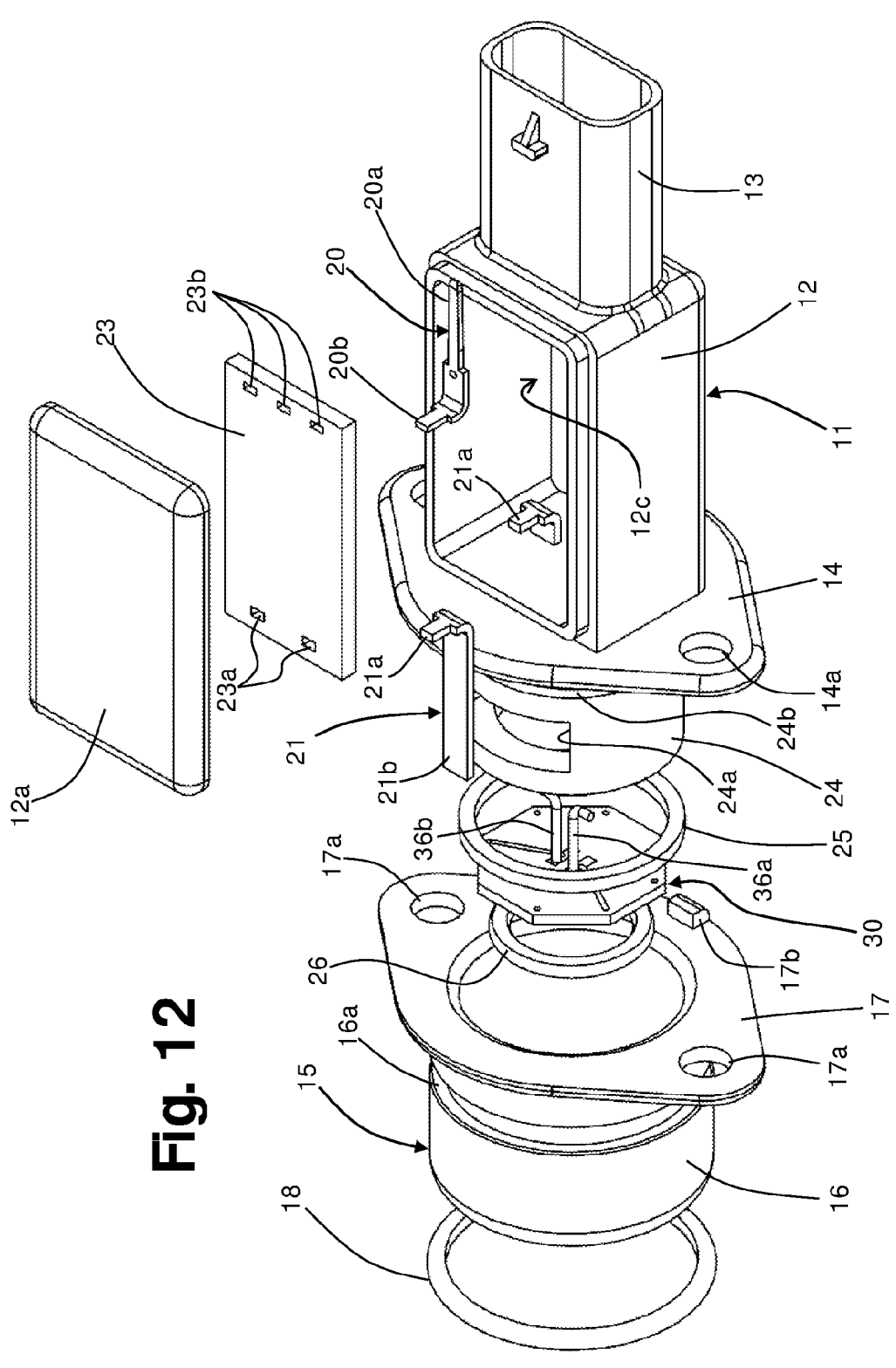
FIG. 12 is a schematic exploded view of a sensor device according to possible embodiments.

In various preferred embodiments, the peripheral wall of the hollow portion 16 of the body part 15, preferably a substantially cylindrical wall, is externally provided with a seat—designated by 16*a* in FIG. 12—for the mounting of a sealing element 18, such as an OR type gasket. Such gasket 18 is provided for example when at least part of the sensor 10, or at least a portion of its body part 15, is inserted into an opening, in order to achieve a radial seal: see for reference FIG. 4, wherein the body part 15 is inserted in the opening 2*a* of the casing 2 of the electrical device or battery 1.

In various preferential embodiments, a wall of the hollow portion 16 of the body part 15, in particular the end or bottom wall 16*a* thereof, is provided with one or more through openings, designated by 19 (see for example FIGS. 5 and 9) for passage of the fluid subject to detection; in the non-limiting example shown, there are four openings 19, including a central hole and three slot-shaped openings, in a peripheral position with respect to the aforementioned central hole. At its inner side, the wall 16*a* can be provided with a recess or indentation, designated by 19*a* only in FIG. 11, at which the inner ends of the openings 19 are located.

Referring also to FIGS. 8-12, the sensor 10 is preferably provided with first connection terminals, designated by 20, which extend through a wall (designated by 12*b* only in FIG. 11) that separates from each other the portions 12 and 13 of the body part 11. The first terminals 20 have a distal end portion, designated by 20*a*, which extends inside the first tubular portion 13, to form therewith an electrical connector, for the connection of the sensor 10 to an external system. The proximal end portion 20*b* of the first terminals 20 extends instead within a cavity 12*c* (FIGS. 10 and 12) defined by the box-like portion 12 of the body part 11.

In various embodiments, body part 11 also has second connection terminals 21, which pass through a wall, preferably a massive part 22 (FIGS. 10-11), which in the non-limiting example depicted extends axially starting from the end of the box-like portion 12 opposite the tubular portion 13. The second terminals 21 have a proximal end portion, designated by 21*a*, which extends within the aforementioned cavity 12*c* defined by the box-like portion 12, in a position generally opposite to the proximal end portions 20*b* of the first terminals 20. The distal end portion 21*b* of the second terminals 21 protrudes axially beyond the wall or massive part 22 of the body part 11.

In various embodiments the proximal end portions 20*b* and 21*a* of the terminals 20 and 21, respectively, are coupled to respective connecting elements of a circuit support 23, which is housed within the cavity 12*c* and on which at least part of the control electronics of the sensor 10 is implemented, in particular at least part of the electronic components required for monitoring the dielectric strength of the fluid, or the corresponding breakdown voltage. For this purpose, the above end portions 20*b*, 21*a* of the terminals can be shaped accordingly, for example be bent and sized to fit into corresponding passages provided on the circuit support 23. The terminals 20 and 21 can be driven into respective passages provided in the body part 11 or, preferably, the body part 11 is overmoulded directly to such terminals.

As shown in the example of FIG. 12, in various embodiments the circuit on the support 23 has at least two connecting elements 23*a* for connection, through the terminals 21, to the sensitive part of a detection element, described below. This circuit may optionally provide two additional connecting elements for a temperature detector, for example an NTC thermistor, arranged on the aforementioned detection element (in which case two additional terminals 21 will preferably be provided for the connection of the temperature detector to the circuit support 23). Again referring to the example in FIG. 12, the circuit on the support 23 has three additional connecting elements 23*b* for the terminals 20, which realize with the tubular portion 13 the connector for the external connection of the sensor 10.

Figures 8, 9, 10, 11:
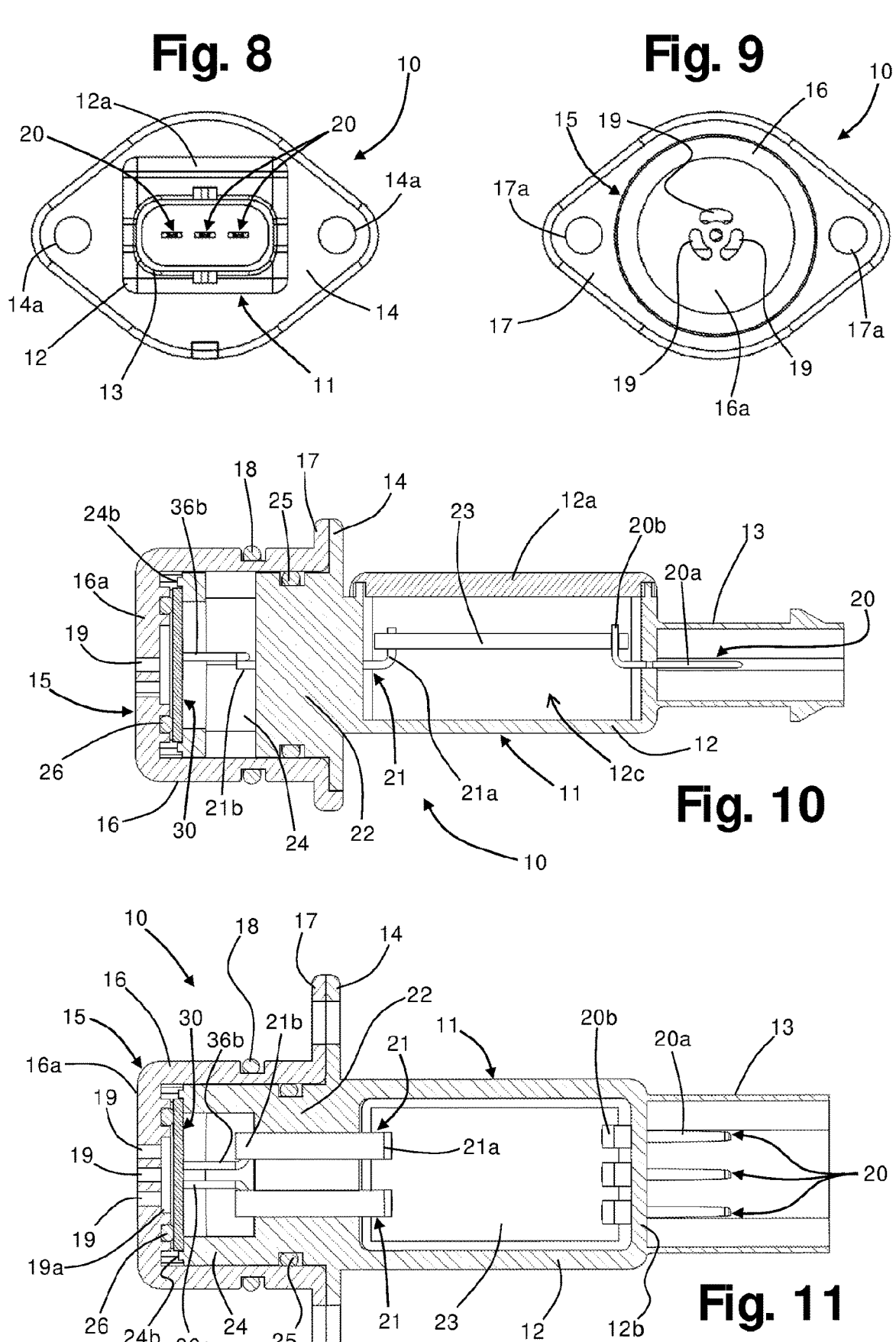
FIGS. 10 and 11 are schematic views sectioned according to axes X-X and XI-XI of FIGS. 6 and 7, respectively.

Particularly from FIGS. 11 and 12 it is noted that, in various embodiments, the body part 11 presents a second tubular end portion 24, which here extends axially from the wall or massive part 22 (in the example, in a position generally opposite to the first tubular portion 13), wherein—within this tubular portion 24—are the ends 21*b* of the terminals 21. The second tubular portion 24 preferably has a peripheral wall substantially cylindrical, or more generally substantially complementary to the section of the cavity of the hollow portion 16 of the body part 15. Preferably, the peripheral wall of the second tubular portion 24 has at least one opening 24*a*, preferably two openings in opposite positions, which in the assembly phase of the sensor 10 enable the electrical connection—for example by welding—of the aforementioned portions 21*b* of the terminals 21 to the respective electrical connection elements (indicated with 36*a* and 36*b* for example in FIG. 12) of a detection element of the sensor 10, indicated as a whole with 30.

In various embodiments, the detection element 30, or a support thereof (designated by 31 for example in FIGS. 13-14), is arranged on the distal end of the second tubular portion 24, which can be provided for this purpose with centering and/or positioning elements (two of these elements are designated by 24*b* in FIGS. 10 and 11). The aforementioned support 31 may be glued or coupled on the tubular portion 24.

In various embodiments, in the assembled condition, the tubular portion 24 with the detection element 30, and possibly at least a portion of the massive part 22, is housed inside the cavity defined by the hollow portion 16 of the body part 15 (see for example FIGS. 10-11). For this purpose, preferably, between the two body parts 11 and 15 there may be provided sealing means, such as the annular gasket designated by 25; for this purpose, the peripheral wall of the second tubular portion 24 can be externally provided with a corresponding positioning seat, designated by 24*b* in FIG. 12.

In various preferential embodiments, further sealing means can be provided between the detection element 30 and the body part 15. In the example, for this purpose there is an annular gasket, designated by 26 for example in FIGS. 10-12, designed to be sealingly set between the aforementioned support 31 (FIGS. 13-14) of the detection element 30 and the wall 16*a* of the hollow portion 16, in which the through openings 19 are located. For this purpose, the inner side of the wall 16*a* can define a corresponding positioning seat—not indicated—for the gasket 26. As can be imagined, the annular gasket 26 delimits, together with the respective portions of the wall 16a and the aforementioned support 31 of the detection element 30, a detection chamber, not indicated, at which the openings 19, and the possible recess 19a, open—at one side—and at which the sensitive part of the detection element 30 (described below) face to—at the opposite side.

A possible example of a detection element 30 is shown in FIGS. 13 and 14.

Element 30 includes a support 31, preferably made of electrically insulating material, for example ceramic or plastic: in the example, suppose that the support 31 is formed with alumina. Still referring to the non-limiting example shown, the support 31 preferably has a square or polygonal peripheral profile (here substantially octagonal), provided with through holes 32. This shape and the presence of the holes 32 is not essential, the shape being possibly different, for example circular.

On the upper face of the support 31 a sensitive part is present, designated by $SG_1$ in FIG. 13, which comprises at least one pair of electrodes on the support, designated by E1 and E2, in particular microelectrodes.

The electrodes E1 and E2 are preferably in the form of thin film. As already mentioned, in various preferential embodiments, the thickness of the metal films that obtain the electrodes E1, E2 is comprised between 50 nanometers and 2 micrometers, preferably from 100 to 500 nanometers. The electrodes E1, E2 can be made of at least two layers of different metallic materials, or a single layer of metal material. In the following it is assumed that both electrodes E1 and E2 are formed by respective layers of platinum and chromium on the support 31, the platinum making the upper layer and the chromium making the lower layer.

The electrodes have respective portions set at a minimum or predefined distance between them, which is a micrometric or sub-micrometric or nanometric distance, preferably comprised between 100 nanometers and 20 micrometers, in order to define therebetween a fixed measurement gap.

In the following, suppose that at the respective points closest to each other, the two electrodes E1 and E2 are at a distance of about 2 microns.

In the exemplified non-limiting case, on the upper face of the support 31 first electrically conductive tracks are provided, for example screen-printed tracks of metallic material or of a conductive paste, designated by 33a and 33b in FIG. 13, which are electrically connected to similar electrically conductive tracks, designated by 34a and 34b in FIG. 13, provided on the lower face of the support 31. The upper tracks 33a, 33b can each extend from the respective electrode E1 or E2 to a respective through hole of the substrate 31 (here the holes designated by 32a and 32b), which is filled or has the surface thereof covered with an electrically conductive material, with which the material of the track 33a or 33b is in contact. Similarly, the lower tracks 34a and 34b are in contact with the material filling, or covering the surface of, the respective hole 32a or 32b, and extend therefrom to a respective contact pads 35a or 35b, respectively, formed with electrically conductive material, from which there departs in turn a connecting element 36a or 36b of the sensing element 30, i.e., of the electrodes E1 and E2 of the sensitive part $SG_1$; elements 36a and 36b can be, for example, represented by electrical conductors, possibly flexible ones.

As already mentioned, a temperature detector, such as an NTC thermistor, can possibly be mounted on the support 31, for example on the lower face thereof, as exemplified with $RT_1$ in FIG. 14. In this case, at least two additional connecting elements or conductors for this detector will also extend from the support 31, for the purpose of connection to the control electronics via suitable terminals 21.

Referring to FIGS. 15-16, in various preferential embodiments, at least one of the electrodes (here the electrode E1) has a portion of the respective peripheral profile which is generally pointed, indicated with E1a, designed to face at a predefined distance, or minimum distance, a corresponding portion, indicated with E2b, of the peripheral profile of the other electrode (here the electrode E2), in order to define the measurement gap, indicated with G in the detail of FIG. 16. The part at a shorter distance between the electrodes E1 and E2 may have relatively small radii of curvature, of the order of microns, at the corresponding pointed profile portion. The choice to provide at least one electrode with a pointed part is aimed at exploiting the so-called "tip effect", which enable use of a low voltage—in particular less than 50 V—in order to possibly obtain a partial electric discharge or a breakdown voltage at the part at a minimum distance between the two electrodes. In the example depicted in FIGS. 13-16 only the electrode E1 has a pointed configuration, but—as it will be see—this does not constitute an essential feature.

As mentioned, the sensor object of the invention is configured for carrying out detections aimed at determining possible losses by conduction in a fluid that is ideally insulating but which, under particular conditions, can partially lose this property. In other words, the sensor enables to directly deduce a possible decay of the dielectric strength of the dielectric fluid with respect to its initial or nominal value or range of nominal values, in particular a decay below a safety threshold.

The principle on which the sensor is based is the possibility of obtaining high electric fields using very small distances between the electrodes. For particular configurations, reported merely by way of non-limiting example, it is possible to create "pointed" electrodes to also exploit the so-called "tip effect", that is a physical phenomenon that occurs whenever there is an electrically charged conductor: this phenomenon consists in the formation of a more intense electric field in areas where the surface of the conductor has a smaller radius of curvature, since the electric field is inversely proportional to this radius. In the presence of a tip the radius of curvature ideally tends to zero, and consequently the electric field ideally tends to infinity.

In reality it is not possible to obtain a nil radius of curvature, but in presence of a tip having a very small radius of curvature (micrometric or sub-micrometric) even if not a nil one, it is possible to obtain electric fields of several tens of kV/cm even with a few Volts of potential. Therefore, using an electrode with a profile defining a tip, such as the electrode E1, and a second electrode whose profile facing the tip is flat, such as the electrode E2 (whose profile could also be of another shape, as it will be seen below), placed at a sufficiently small distance, a flow of current can be obtained due to the corona effect (a phenomenon that is generated in presence of two conductors between which there is a high potential gradient and which consists of a passage of electric current in the fluid in which these electrodes are immersed, due to the ionization caused by the high electric field being present). The high electric field is obtained both by the pointed shape of one or both electrodes, and by the close distance between the two electrodes. It should also be noted that the very thin thickness of the film contributes to the increase in the local electric field to an even greater extent than the pattern in the plane. A further advantage of having a limited facing area of the two electrodes is to limit in any way the possible electric discharge to a limited and well-located volume.

Therefore, for example, by placing the two electrodes E1 and E2 immersed in the fluid being measured in parallel to a capacity electrically charged at an appropriate voltage level—depending on the monitored fluid and/or the minimum distance between the electrodes (i.e., the characteristic size of the detection gap)—it is possible to determine the level of degradation of the fluid based on the residual voltage level, measured on the capacity after a predetermined time interval.

The lower the voltage level, the higher the current between the electrodes, the more the fluid will have lost its insulating properties. It is therefore possible to correlate the residual voltage level on a capacity, after a predetermined time, to the insulating properties of the fluid, to deduce the dielectric strength thereof.

FIGS. 17 and 18 show possible alternative embodiments of a detection element 30, wherein on support 31—here having a circular shape and formed for example with fiberglass and epoxy resin (vetronite) or other material suitable for printed circuit board or PCB, or with alumina—a substrate 31a is deposited, formed with silicon oxide obtained on a silicon wafer 31b, and on substrate 31a a plurality of pairs of electrodes E1-E2 are defined, to form the sensitive part $SG_1$ of the detection element 30.

The electrodes E1 and E2 of each pair can possibly define detection gaps having different amplitude, for the reasons explained above. The substrate 31a preferably has a thickness of not less than the distance between the electrodes E1 and E2 at the smallest measurement gap, but preferably greater than said distance.

In the example, the various electrodes E1 and E2 are connected to the respective connecting conductors 36a, 36b by wire bonding, via micro-wires 37a and 37b, preferably based on a noble metal. In the example, however, the micro-wires 37b of the electrodes E2 are connected to a common pad, indicated with 35b in FIG. 18, from which a single connecting conductor 36b departs: in the example, therefore, the detection element 30 includes only three connecting conductors (without prejudice to the possible additional presence of the aforementioned temperature detector, in which case at least one additional conductor will be provided, preferably at least two additional conductors).

In embodiments of the type shown in FIGS. 17-18, the use of the silicon wafer allows to obtain a highly doped area, which can be used as a gate electrode, to modulate the partial discharge between the detection gap of the pair or of each pair of electrodes E1-E2, in case it is desired to obtain particularly fine measurements of the transport phenomena inside the fluid, for example, by giving the sensor greater selectivity with respect to certain contaminants.

The polarization of the fluid molecules could in fact modify the electrical conduction thereof. In this perspective, a phenomenon that could be exploited is that of the remarkable electronegativity of the fluorine atoms present in the molecules of some fluids commonly used for insulation and cooling in batteries, such as hydrofluoroethers (HFE), for example 1,1,1,2,2,3,3-Heptafluoro-3-methoxypropane.

During the discharge between the electrodes E1-E2, fluorine atoms tend to segregate free electrons, which is one of the reasons why fluids of this type have relatively high breakdown voltages. The presence of a gate voltage can influence the polarization of the molecules, creating different paths, to facilitate or hinder the discharge depending on the value and polarity of the gate voltage. It could therefore be obtained—through appropriate mapping—the detection of different contaminants by measuring the current between the main electrodes (the electrodes equipped with a "tip" or "tip—plane" for example, would become the source and the drain) as a function of the gate voltage.

The further advantage of using a substrate 31a at least partly in silicon consists in the possibility of integrating directly into the substrate the driving circuit of the sensitive part $SG_1$, or at least a part of said circuit.

As mentioned, in any case, it is possible to use insulating supports or substrates, depositing directly on their surface the pair or pairs of electrodes E1-E2, or by else obtain a suitable gate electrode, and then depositing an insulating layer thereon (for example a polymer layer with a thickness of a few microns, for example 2-10 microns), on which forming subsequently at least one pair of electrodes E1-E2 between which the discharge takes place. An example of this type will be described with reference to FIGS. 34-38.

Figure 23:
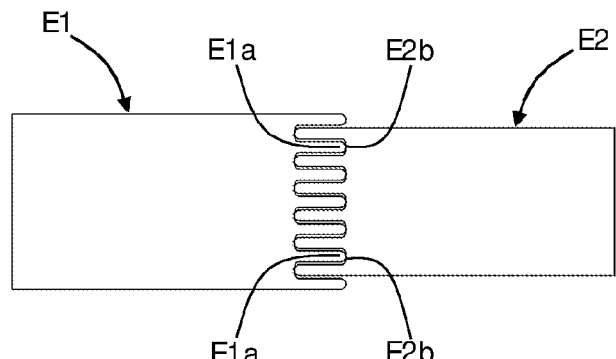

In the event that the sensitive part $SG_1$ of a sensing element 30 comprises several pairs of electrodes E1-E2, the measurement gaps supplied at one and the same voltage may be individual, as in the case of FIG. 17, or two electrodes E1 and E2 can define several measurement gaps therebetween working in parallel at the same voltage and with the same distance, as in the case of FIG. 23, to have redundancy and avoid any malfunctions (such as gas bubbles or impurities at a gap).

FIGS. 19-20 illustrate a possible alternative geometry of two electrodes E1-E2, each distinguished by a respective pointed portion E1a and E2b of the respective peripheral profile. Such an embodiment can for example be advantageous to maximize the local electric field.

Figure 21:
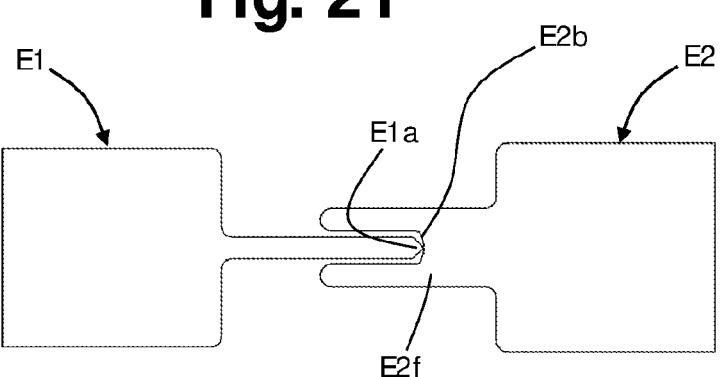
Figure 22:
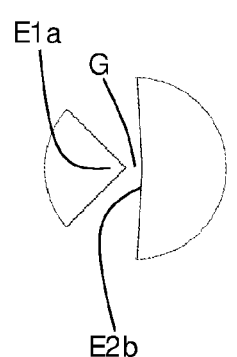

FIGS. 21-22 illustrate a further possible alternative geometry of two electrodes E1-E2, wherein the peripheral profile of the electrode E1 has an axially extended protruding portion Ela, which is insinuated between two extended and parallel parts of a shaped portion E2b of the peripheral profile of the electrode E2. Such an embodiment can, for example, be advantageous to improve the homogeneity of the chemical attack process of the thin film during the manufacture of the microelectrodes.

Figure 24:
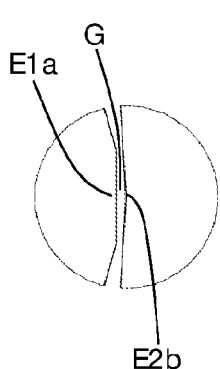

FIGS. 23-24 illustrate a further possible alternative geometry, wherein the facing portions of the peripheral profiles of the two electrodes E1-E2 have a substantially interdigitated-combs configuration, that is, with the succession of protrusions E1a of the electrode E1 received in the succession of recesses E2b of the electrode E2. As already mentioned, such an embodiment can for example be advantageous to define—by means of two electrodes only—a plurality of equal measurement gaps working in parallel, for reasons of redundancy and for avoiding occasional malfunctions due to external causes, such as bubbles or impurities at a single gap. Although in this case the value of the electric field—with the same applied voltage and the same minimum distance between the electrodes—can be reduced compared to the "tip-to-plane" or "tip-to-tip" case, the embodiment can be advantageous in the case of fluids with higher conductivity, for example because they are polluted and/or deteriorated, ensuring greater robustness of the electrodes that would be less subject to damage to the field itself applied during the discharge.

Figures 3, 4:
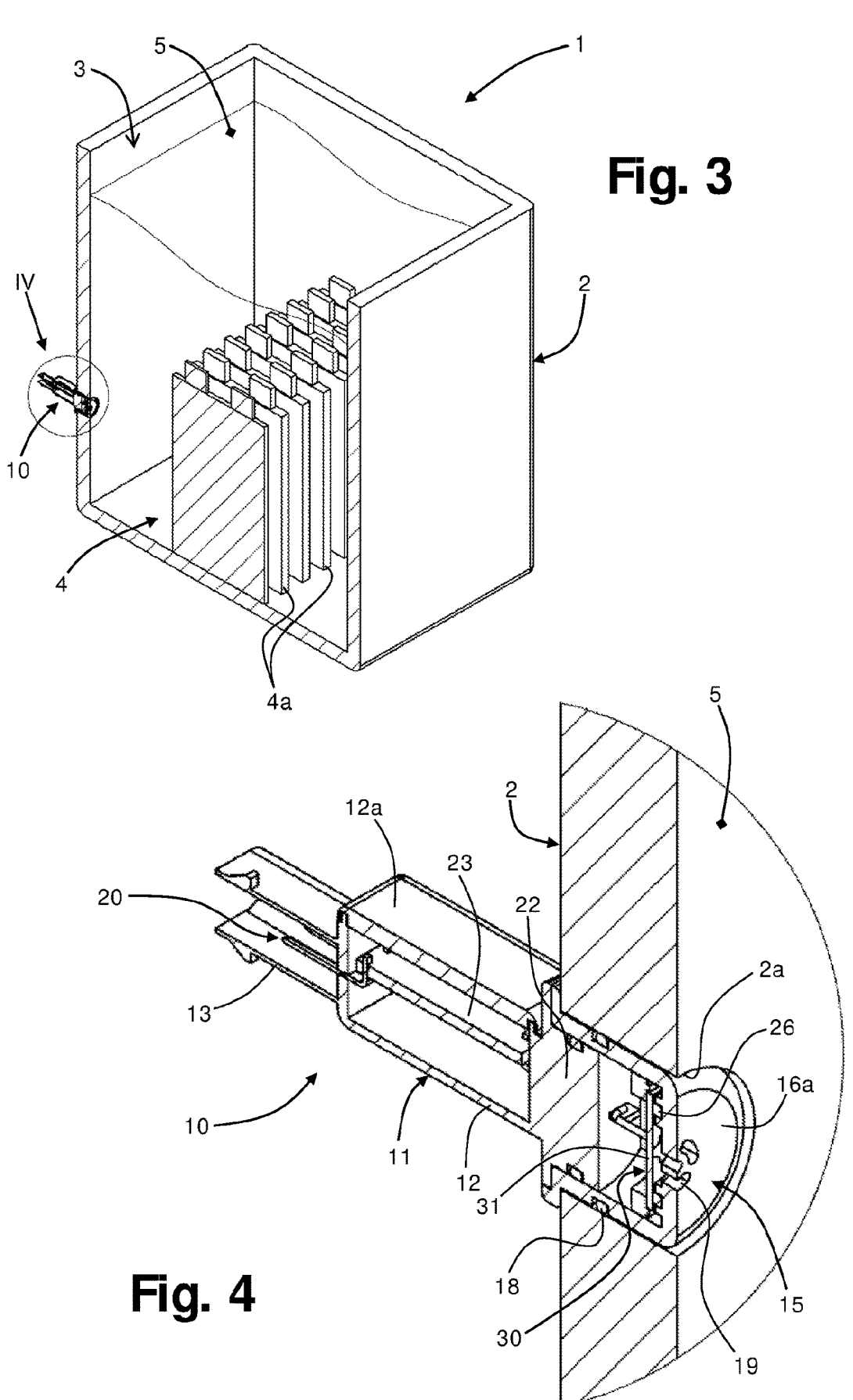
FIGS. 3 and 4 are a sectioned perspective view and a corresponding enlarged detail, respectively, of the electrical device of FIGS. 1-2.

The sensor 10 is mounted so that its body part 15 is at least partially exposed—at least at its wall 16a—to the fluid being detected, as exemplified for example in FIGS. 3-4.

In this way, part of fluid 5 can penetrate through the through openings 19, and reach the detection chamber delimited between the sealing element 26, the inner side of the wall 16a and the support 31 of the detection element 30;

given that the sealing element 26 circumscribes a region of the upper face of the support 31 in which at least one pair of electrodes E1-E2 is located, said electrodes are both in contact with the fluid 5.

Figure 25:
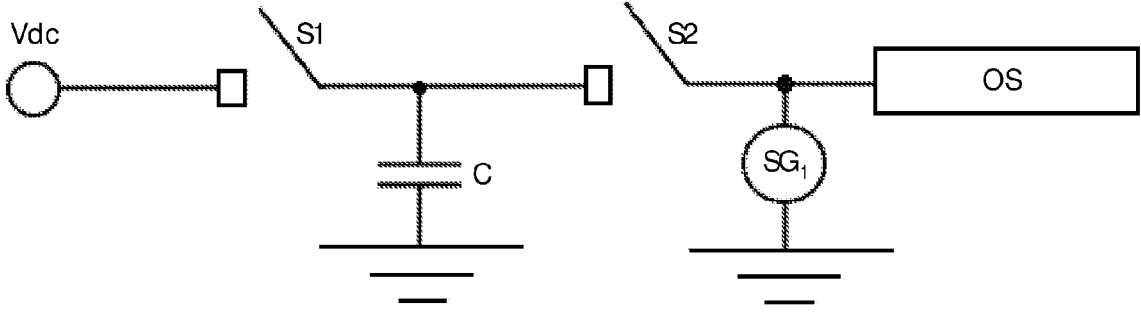
FIG. 25 is a simplified electrical circuit intended to exemplify a possible principle of operation with a capacitive driving of a sensor device according to possible embodiments.

FIG. 25 shows schematically a possible principle of operation of a sensor 10, wherein Vdc indicates a low voltage source, S1 and S2 indicate two switches (preferably of electronic or controllable type), C indicates a capacitor of a known or predefined electrical capacity, and $SG_1$ indicates a sensitive part with at least two electrodes of the type previously indicated with E1 and E2. OS designates a detection device or instrument, such as an oscilloscope. The sensor is, as mentioned, mounted so that the fluid subject to detection submerges the electrodes E1-E2, thus also creeping into the detection gap G.

By closing the switch S1, the capacitor C is charged at the voltage of Vdc. Then the switch S1 is made to open and the switch S2 is made to close, so discharging the capacitor C on the measurement gap defined between the electrodes of the sensitive part $SG_1$, between which part of the fluid is located.

Figure 26:
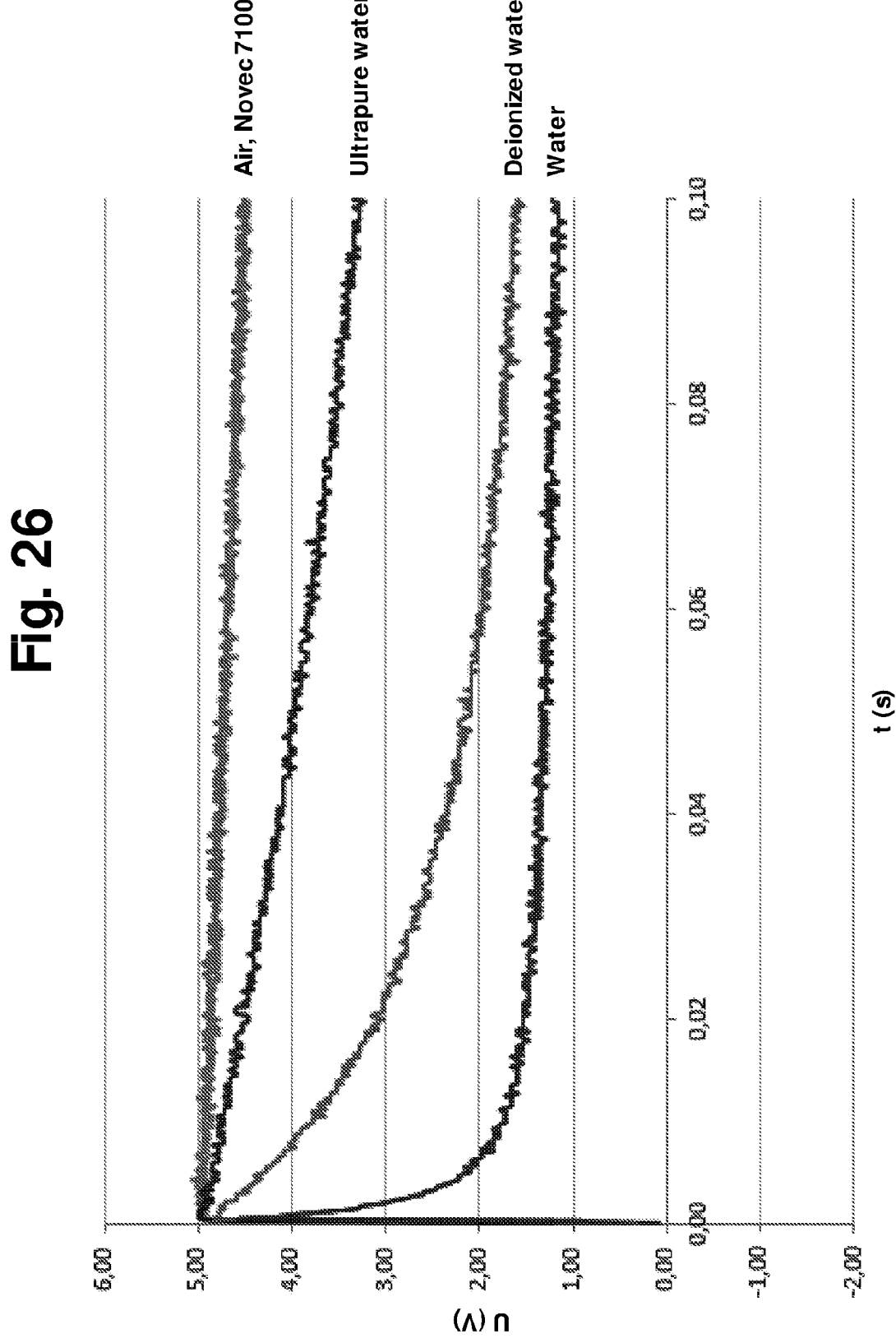
FIG. 26 is a graph showing examples of measurements carried out on some types of fluids by means of a sensor device in accordance with the invention.

The graph in FIG. 26 shows typical discharge trends for some types of fluid, as detected by the Applicant by means of a sensor device in accordance with the invention and operating according to the principle indicated above. The tests were carried out using a Vdc voltage of 5 V, a capacitor C with a capacity of 100 nF and a sensitive part $SG_1$ with electrodes E1 and E2 in chromium, having a geometry of the type shown in FIG. 15, and a detection gap G of 2 micrometers. In the graph, in abscissa the time t in seconds is expressed, while in ordinate the voltage U in volts is expressed.

Novec 7100™ is, for example, one of the fluids typically used for thermal conditioning of the electrochemical cells of a battery: the electrical discharge represented is substantially coinciding with that of air (the two curves on the graph are practically not distinguishable) and the time constant is that relating to the capacity of 100 nF on a resistor of 10 MOhm (internal resistance of the oscilloscope OS used).

The same fluids referred to in the graph of FIG. 25 were also analyzed by means of a dielectric strength meter, the typical instrument used for measuring the dielectric strength of a material. The corresponding results are set out in Table 1 below:

TABLE 1

| Fluid | Recorded discharge voltage | Conductivity (μS/cm) |
|---|---|---|
| Novec 7100 | Insulating | 0 |
| Ultrapure water | 2.4 kV/cm | 0 |
| Deionized water | 400 V/cm | 20 |
| Water (tap) | <50 V/cm | 319 |

With the dielectric strength meter it was possible to measure for ultrapure water a discharge voltage of about 2.4 kV/cm, while with a benchtop instrument for measuring conductivity, sensitive to nS/cm, it was not possible to measure any conductivity: this is due to the fact that ultra-pure water becomes conductive in presence of high electric fields caused by the generation of local charge, and not by virtue of free charges already present in the fluid. On the other hand, with the sensor 10 in accordance with the invention it is possible to verify the quality of the electrical insulation of the fluid in a direct way: as can be seen from the graph in FIG. 26, in fact, the curve relating to ultrapure water is well distinguished both from that of Novec and from those of less pure waters (deionized water and mains water).

The sensor according to the invention can be made according to different circuit variants, for a capacitive- or resistive-type operation.

Figure 27:
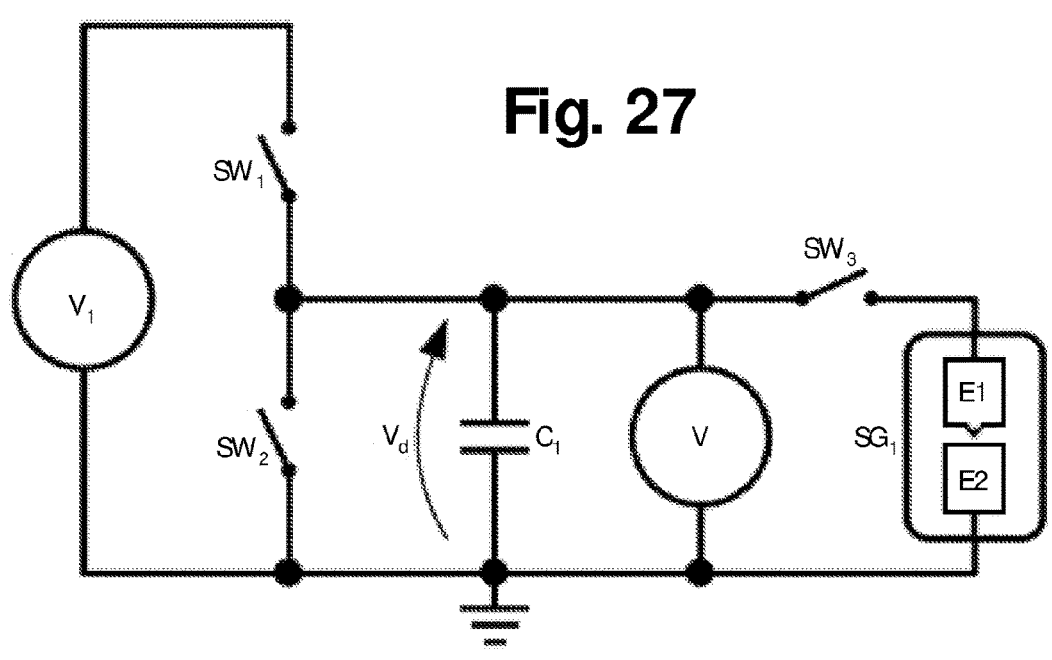
FIGS. 27 and 28 exemplify possible circuits of as many sensor devices according to possible embodiments, based on a capacitive-type driving principle of the sensitive part.

FIG. 27 shows, for example, a scheme of principle for a unipolar driving of the sensor 10, with reference to the aforementioned capacitive operation. The figure shows the only essential components useful for understanding the operation, namely:

with $SG_1$ there is schematized the sensitive part in which the electric field is generated at the measurement gap G, consisting of a pair of electrodes E1-E2 of the type described, or consisting of several pairs of electrodes possibly connected in parallel with each other;

$C_1$ indicates the capacitor that realizes the capacity of which the residual voltage is to be measured;

with $V_d$ the voltage at the ends of the capacitor C1 is indicated, where the arrow identifies its direction;

$V_1$ indicates a generic source of constant voltage;

V indicates any system or device capable of measuring the level of voltage $V_d$ on the capacitor $C_1$, such as a voltmeter or an analog-to-digital conversion system, with $SW_1$, $SW_2$ and $SW_3$ generic controlled switches are indicated.

Not all the switches $SW_1$, $SW_2$ and $SW_3$ are necessarily present, and may be arranged in circuit positions slightly different from the exemplified one. Preferably, the capacitance value of the capacitor $C_1$, the voltage supplied by the source $V_1$ and the characteristic size of the detection gap (minimum distance between the electrodes E1, E2) is chosen according to the type of fluid subject to monitoring.

According to a preferential control method, at a time $T_0$ the switch stands open $SW_1$, the switch $SW_3$ is made to open and the switch $SW_2$ is made to close, bringing to 0 V the voltage $V_C$ at the terminals of the capacitor $C_1$.

At a later time $T_1$ the switch $SW_2$ is made to open and the switch $SW_1$ is made to close, keeping the switch $SW_3$ open: in this way, the voltage $V_d$ on the capacitor $C_1$ is brought to a level equal to $V_1$ ($V_d \approx V_1$).

At a later time $T_2$ the switch $SW_1$ is made to open, with the switch $SW_2$ always open, and the switch $SW_3$ is made to close.

At a later time $T_3$, i.e. after a predetermined and known time interval, the voltage $V_d$ on the capacitor $C_1$ is measured using the measuring device V. The level of the measured voltage is in direct correlation with the insulating property of the fluid and is therefore transmitted as output data from sensor 10. The measurement cycle can be periodically performed starting from time $T_0$. In a configuration of this type, in the event that the residual voltage measured at the terminals of the capacitor falls below a determined threshold value, it can be deduced that the dielectric strength of the fluid is no longer sufficient to allow a safe use of the fluid itself, and a suitable alarm signal can be activated accordingly.

Note that the switches $SW_1$ and $SW_2$ form a so-called half-bridge structure, which can be easily obtained by means of discrete transistors, or integrated circuits customized for this function, or by means of the push-pull outputs of a generic microcontroller or integrated circuit. The switch $SW_3$ can be obtained by means of relays, or integrated analog switches, or FET transistors, or other systems suitable for this purpose.

In an alternative version it is possible to design a driving in which the presence of the switch $SW_3$ is omitted. In this case the circuit is simplified, with corresponding reduction in costs and dimensions. The disadvantage is a higher current consumption and a possible faster degradation of the electrodes E1-E2.

The switch $SW_2$ may be omitted, but in this case—generally—there will not be a complete discharge of the capacitor $C_1$ between a measurement cycle and another one, which is however irrelevant in the proposed unipolar use. However, its usefulness in the case of bipolar use of the sensor 10 it will be clear below.

Figure 28:
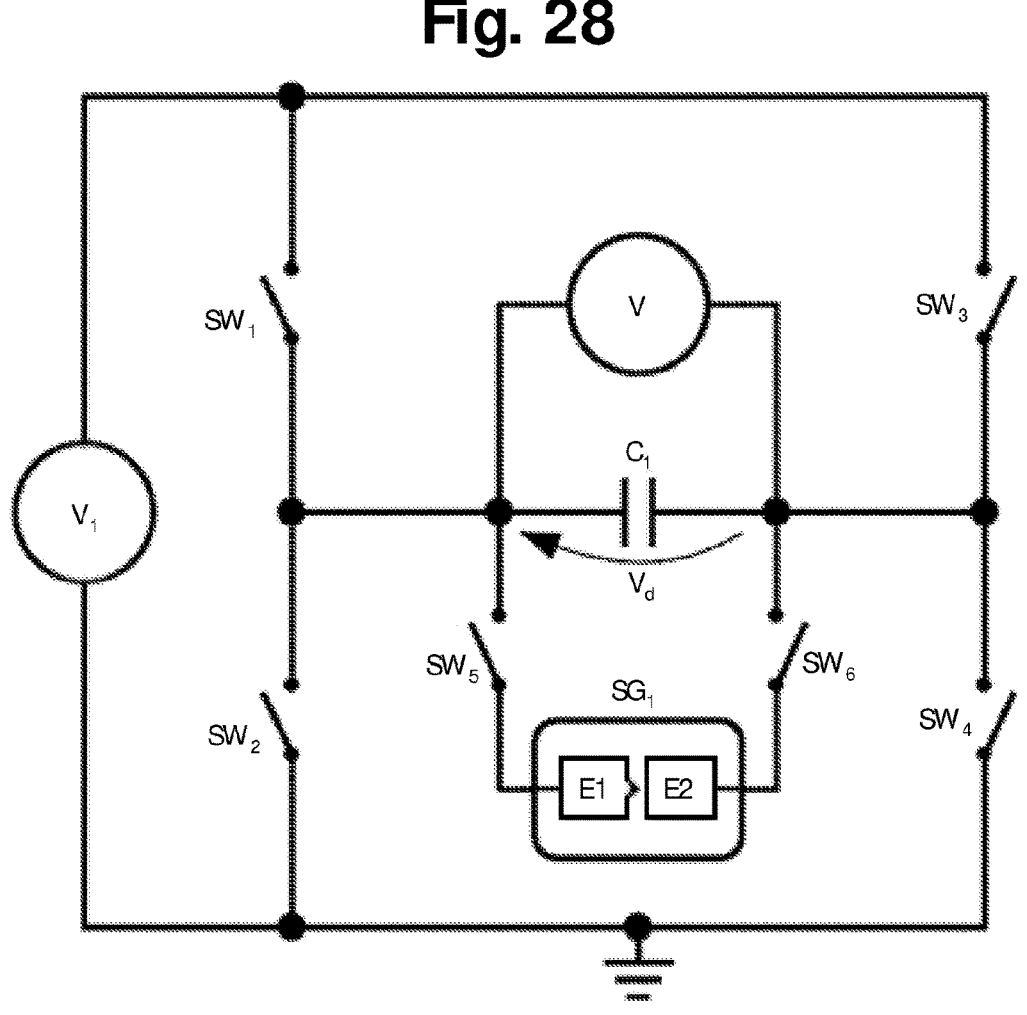

FIG. 28 shows a scheme of principle for a bipolar driving of the sensor 10, always in relation to the aforementioned capacitive method; also in this case the figure highlights the only essential components useful for understanding the operation.

In order to improve the durability of the $SG_1$ sensing element, it is possible to use a bipolar driving, i.e., a driving such that the voltage $V_d$ at the terminals of the capacitor $C_1$ can take both positive and negative values. Through this expedient, the electric field that is generated between the two electrodes E1-E2 changes polarity depending on the $V_d$ voltage present on the capacitor $C_1$, thus minimizing any deposition effects due to the galvanoplastic effect on said electrodes. To obtain this type of driving, a so-called "full-bridge" structure is used, as illustrated in the principle diagram of FIG. 28, in which the components indicated with $SG_1$, $C_1$, $V_d$, $V_1$ and V are similar to those described with reference to FIG. 27.

With $SW_1$, $SW_2$, $SW_3$, $SW_4$, $SW_5$ and $SW_6$ generic controlled switches are indicated, which also in this case are not necessarily all present, and can possibly be arranged in circuit positions slightly different from the one exemplified.

According to a preferential control method, at time $T_0$ the switches $SW_1$, $SW_3$, $SW_5$ and $SW_6$ switches are open, the switch $SW_2$ is closed, and the switch $SW_4$ is also closed, bringing the $V_d$ voltage level at the terminals of the capacitor $C_1$ to 0 V.

Note that the condition of keeping the capacitor at 0 V can be omitted, that is, the state of the circuit at time $T_0$ is optional.

At a later time $T_1$ the switch $SW_2$ is made to open and the switch $SW_1$ is made to close, maintaining the state of the other switches, and thus bringing the voltage $V_d$ on the capacitor $C_1$ to a level equal to $V_1$ ($V_d$ $V_1$).

At a later time $T_2$ the switch $SW_1$ is made to open and the switches $SW_5$ and $SW_6$ are made to close, maintaining the state of the other switches. Note that the condition of closing the switches $SW_5$ and $SW_6$ may be omitted, i.e., switches $SW_5$ and $SW_6$ may not be present, or the electrodes E1-E2 of the sensitive part $SG_1$ may always be connected in parallel to the capacitor $C_1$.

At a subsequent $T_3$ time, i.e., after a predetermined and known time interval, the voltage on the capacitor $C_1$ is measured using the device V, possibly following the opening of the switches $SW_5$ and $SW_6$, if any. As mentioned for the case of FIG. 28, the measured voltage level is in direct correlation with the insulating property of the fluid and is then transmitted as output data from the sensor 10.

At a later time $T_4$ is closed the switch $SW_2$ is made to close, maintaining the state of the other switches, and in particular the closed state of the switch $SW_4$, thus bringing the level of the voltage $V_d$ at the terminal of the capacitor $C_1$ to 0 V.

At a later time $T_5$ the switch $SW_4$ is made to open and the switch $SW_3$ is made to close switch, maintaining the state of the other switches, thus bringing the $V_d$ voltage on the capacitor $C_1$ to a level equal to $-V_1$($V_d$≈$V_1$).

At a later time $T_6$ the switch $SW_3$ is made to open and the switches $SW_5$ and $SW_6$ are made to close, maintaining the state of the other switches. As mentioned, closure of the switches $SW_5$ and $SW_6$ can be omitted, or they may not be present, or the electrodes E1-E2 can always be connected in parallel to the capacitor $C_1$.

At a later time $T_7$, i.e., after a predetermined and known time interval, the voltage on the capacitor $C_1$ is measured, possibly following the opening of the switches $SW_5$ and $SW_6$, if any. Again, the measured voltage level is in direct correlation with the insulating property of the fluid and is then transmitted as output data from the sensor 10.

The measurement cycle can then be performed again starting from time $T_0$.

The switches $SW_1$-$SW_2$ and $SW_3$-$SW_4$ form the afore-mentioned "H bridge" structure (full bridge), which also in this case can be easily obtained by means of discrete transistors, or integrated circuits specialized for this function, or by means of the push-pull outputs of a generic microcontroller or integrated circuit. Also in this case the switches $SW_5$ and $SW_6$ can be obtained by means of relays, or integrated analog switches, or FET transistors, or other systems suitable for the purpose.

As it can be sees, according to the scheme of principle of FIG. 28, it is possible to carry out a driving of the $V_d$ voltage on capacitor $C_1$ of a bipolar type, that is, in which the voltage at the terminals of the capacitor $C_1$ can be reversed, or be both positive and negative on the same terminal.

In embodiments of the type described with reference to FIGS. 25, 27 and 28 the representative voltage that is measured varies as a function of the discharge time of the capacitor. The capacitor can discharge for two reasons: non-nil resistance in the measuring circuit (and this is inevitable in real circuits), and consequent current that flows in the circuit, or current flowing between the two electrodes of the detection gap. Above a certain threshold there is a discharge, meant as a current between the two electrodes due to an increase in charge carriers, tied not only to the corona or "tip" effect previously explained, but also to a dissocia-tion of new charge carriers (electrons and positive ions) in the fluid. Whether the discharge of the capacitor is more or less gradual or sudden depends on the relative values of capacitance and current in the detection gap. For illustrative purposes, to completely discharge a 100 nF capacitor charged with a voltage of 5 V in 1 second, an average current of 0.5 microA is needed: this corresponds, through a detec-tion gap of the type considered here, to a current density which can be estimated at around 500 A/cm², that is a current density certainly not small for a fluid that has to be considered as insulating.

Figure 29:
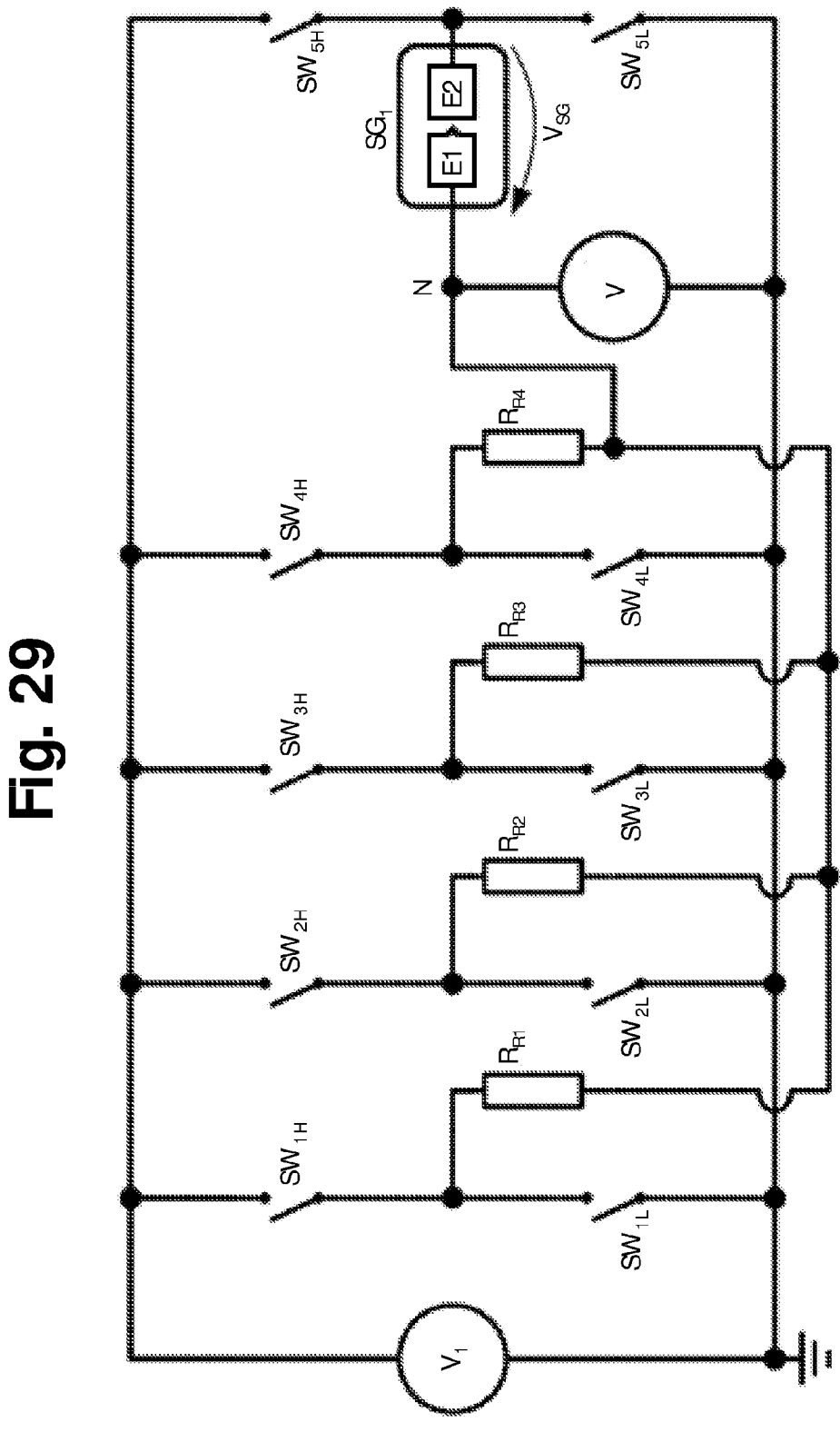
FIG. 29 exemplifies a possible circuit of a sensor device according to possible forms of actuation, based on a resistive-type driving principle of the sensitive part.

The driving principles described with reference to FIGS. 25, 27 and 28 can be defined as "capacitive", as they exploit the discharge of a capacitor to provide the detection gap G with a defined amount of electric charge. In accordance with other embodiments of the invention, however, it is possible to use systems of a fully resistive type, both for unipolar driving, and for the bipolar driving. An example in this sense is shown in FIG. 29, wherein only the essential components useful for understanding the operation are highlighted. Also in FIG. 29 the components indicated with $SG_1$, $V_1$ and V are similar to those described with reference to FIGS. 27 and 28.

In FIG. 29:

with $SW_{XL}$ and $SW_{XH}$—with X ranging from one (1) to four (4)—generic controlled switches are indicated, which also in this case are not necessarily all present, and can possibly be arranged in circuit positions slightly different from the exemplified one;

with $RR_X$—with X ranging from one (1) to four (4)—reference resistors are indicated, through which a resistive divider is obtained, connecting them alternately to the sensitive part $SG_1$ through the various $SW_{XH}$ and $SW_{XL}$ switches;

$VS_G$ indicates the voltage between the two electrodes E1-E2 of the sensitive part $SG_1$, the arrow indicating the direction;

The system or device V is configured here to measure the voltage level at the node indicated with N.

The principle of operation is that of the voltage divider. The detection gap is placed in series to another resistance R (the value of this resistance can be varied as described below, using more resistances and a suitable circuit configuration). When voltage is applied to the detection gap in series to a certain resistance R, the entire voltage $V_1$ is present at the ends of the gap, since in the absence of current the potential of the node N is zero (ground). If this voltage $V_1$ is sufficient to generate a current through the detection gap, the potential of N will vary to a value $V(t)=Ri(t)$, which will stabilize at a certain value V. This configuration allows to define an equivalent resistance of the gap as described in detail below.

Note that, in the exemplifying description, reference is made to a system that uses four (4) reference resistors $R_R$, but the circuit can also be extended to a greater number of resistors, or reduced to a smaller number.

Also in this case, preferably, the resistance value of the resistors $R_R$ and their number, the voltage supplied by the source $V_1$ and the characteristic dimension of the detection gap (minimum distance between the electrodes E1, E2) is chosen according to the type of fluid subject to monitoring.

With reference to the diagram in FIG. 29, in the case of unipolar driving there can be two cases:

1) the switches from $SW_{1L}$ to $SW_{4L}$ and $SW_{5H}$ are not present, while the $SW_{5L}$ switch can be replaced by a short-circuit, or always be closed; the switches from $SW_{1H}$ to $SW_{4H}$ are alternately closed one at a time and the voltage at the node N is measured, after a settling time;

2) the switches from $SW_{1H}$ to $SW_{4H}$ and $SW_{5L}$ are not present, while the switch $SW_{5H}$ can be replaced by a short-circuit, or always be closed; the switches from $SW_{1L}$ to $SW_{4L}$ are alternately closed one at a time and the voltage at the node N is measured, after a settling time.

Still with reference to the scheme of FIG. 29, in the case of bipolar driving, similarly, there can be two cases, very similar to the previous ones:

1) the switches $SW_{1L}$ to $SW_{4L}$ and $SW_5H$ switches are open, while the switch $SW_{5L}$ is always closed; the switches $SW_{1H}$ to $SW_{4H}$ are alternately closed one at a time and the voltage at the node N is measured, after a settling time;

2) the switches $SW_{1H}$ to $SW_{4H}$ and $SW_{5L}$ are open, while the switch $SW_{5H}$ is always closed; the switches $SW_{1L}$ to $SW_{4L}$ are alternately closed one at a time and the voltage at the node N is measured, after a settling time.

Figure 30:
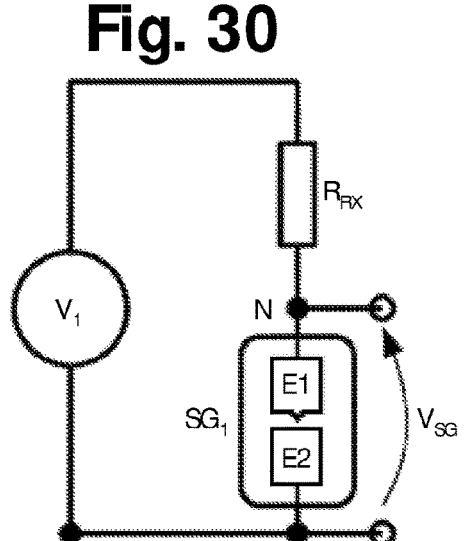
FIGS. 30 and 31 exemplify circuits equivalent to those of FIG. 29, in the case of unipolar or bipolar driving, respectively.
Figure 31:
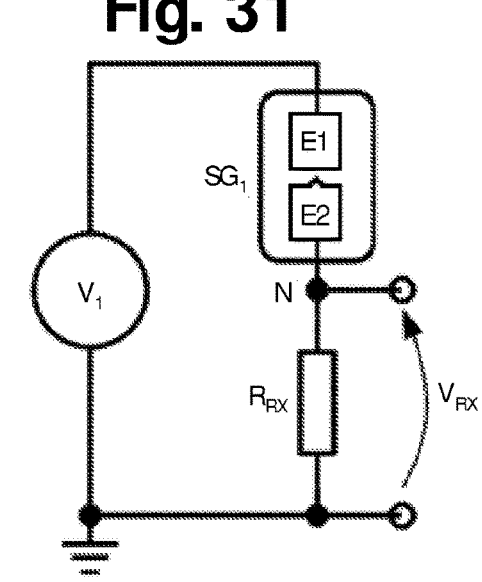

Both in the case of unipolar driving and in the case of bipolar driving, it can easily be deduced that the equivalent circuits shown in FIGS. 30 and 31 are obtained.

In the case of unipolar driving, for each measurement cycle, there will be only one of the two cases, depending on which configuration is chosen. Conversely, in the case of bipolar driving, the two circuit configurations that are determined depending on the state of the switches alternate between one measurement cycle and the next one.

Using this so-called "proportional" method, it is possible to carry out the measurement while always maintaining the same reference for the measuring system.

For convenience, but it is not a binding choice, consider using 0 V as a reference. In this way, in case 1) the voltage $VS_G$ will be directly measured at the terminal of the sensitive part $SG_1$ (FIG. 30), while in case 2) the voltage $VR_X$ will be measured at the terminals of the resistor $R_{RX}$.

Note that, in case 2), if the same conventions are maintained as in case 1), the voltage $VS_G$ at the terminals of the sensitive part $SG_1$ becomes negative: this is evidenced by the fact that the electrical symbol of $SG_1$ is vertically reversed in FIGS. 30 and 31. From a physical viewpoint, what is obtained is the inversion of the electric field at the terminals of the sensitive part $SG_1$, similarly to the capacitive method previously described.

In case 1) the equivalent resistance $R_{SG}$ at the terminals of the two electrodes E1 -E2 of the sensitive part $SG_1$ is given by the following formula:

$$R_{SG} = R_{R_X} \times \frac{V_{SG}}{V_1 - V_{SG}}$$

In case 2) the equivalent resistance to the terminals of the two electrodes E1-E2 of the sensitive part $SG_1$ is given instead by the following formula:

$$R_{SG} = R_{R_X} \times \frac{V_1 - V_{R_X}}{V_{R_X}}$$

With reference to the example in FIG. 29, it should be noted that the electrode E2 is at the fixed potential V. Consequently, measuring the voltage at node N with respect to ground or with respect to V is absolutely equal, less than a known constant represented by voltage V: the information content is therefore the same.

For the purpose of a correct operation of the sensor 10 on the entire temperature range provided by the application, a temperature measurement can also be used, through a suitable temperature detector located near the sensitive part $SG_1$; as mentioned, such a temperature detector can include an NTC-type thermistor.

Through the detection of the temperature, a correction can be applied to the voltage level measured at the terminals of the capacitor $C_1$ of FIGS. 27-28, or to the equivalent resistance measured by the proportional method referred to in FIGS. 29-31, by means of a suitable compensation polynomial of grade 1 or higher. For the purpose of determining the coefficients of the compensating polynomial, for example, two or more measurements of the voltage level or resistance may be made at different and known temperatures in a reference fluid.

Figure 32:
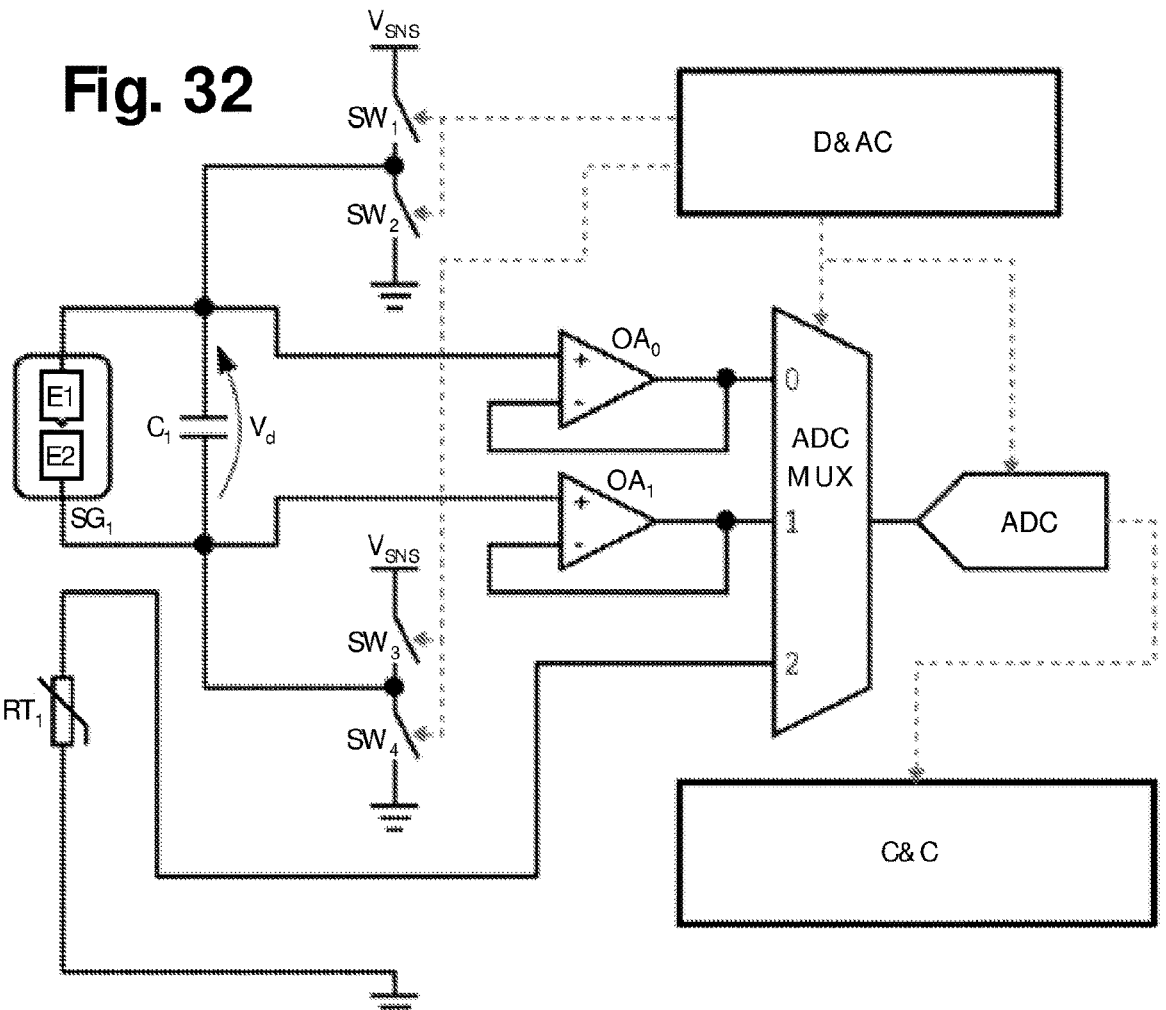
FIGS. 32 and 33 exemplify possible circuits of as many sensor devices according to possible embodiments, also integrating a temperature detection function based—respectively—on a capacitive-type and a resistive-type driving principle of the sensitive part.

FIG. 32 shows a simplified diagram of a possible implementation used for obtaining the sensor 10, based on the capacitive method with bipolar driving and with temperature detection for compensation purposes.

Omitting the passive and protection components, which are in any case necessary for the correct operation of the circuit, and given that the elements $SG_1$, $C_1$ and $V_d$ elements are similar to those previously described, we have the following fundamental elements:

with $RT_1$ a temperature detector is designated, placed near the electrodes E1-E2, used to carry out temperature compensation;

with $SW_1$, $SW_2$, $SW_3$ and $SW_4$ switches are designated, of the type already indicated above, particularly in relation to FIG. 28, which can be obtained for example via two outputs of GPIO type (General Purpose Input/Output) of a generic microcontroller, which are configurable at will;

with $V_{SNS}$ a generic source of constant voltage is indicated, through which the capacitor $C_1$ is charged, i.e. the driving voltage of the sensor 10;

with $OA_0$ and $OA_1$ two operational amplifiers are indicated, used as voltage trackers in order to decouple the measuring capacitor $C_1$ from the input of the acquisition system, ensuring a very high input impedance (by acquisition system the part of the circuit from the electrodes E1-E2, excluded, to the converter ADC is meant); these operational amplifiers can possibly also be used in amplifier configurations, inverting or non-inverting, in alternative circuit implementations;

with ADC a generic analog to digital converter is indicated;

with ADC MUX a generic multiplexer is indicated, set between the inputs of the quantities to be acquired and the converter ADC;

with D&AC (Drive & Acquisition Control) a block, representing the control algorithm of the driving system, the ADC MUX multiplexer and the ADC converter, is indicated;

with C&C (Computation & Communication) a block representing the temperature compensation algorithm, the calculation of the measured value and the communication protocols is indicated.

Preferably, the control algorithm of the switches $SW_1$, $SW_2$, $SW_3$ and $SW_4$ switches is similar to that described with reference to FIG. 28, in relation to the bipolar driving of the sensor 10. The part previously indicated with V, or the measuring system or device, consists here of the operational amplifiers $OA_0$ and $OA_1$, the multiplexer ADC MUX and the converter ADC.

In operation, between two successive cycles of measurement of the voltage level on the capacitor $C_1$ (inputs 0 and 1 of the multiplexer) a temperature detection is carried out (input 2 of the multiplexer) through the detector $RT_1$, necessary to carry out the corresponding compensation as previously described, on the basis of the aforementioned polynomial, at the voltage level measured at the terminals of the capacitor $C_1$.

Figure 33:
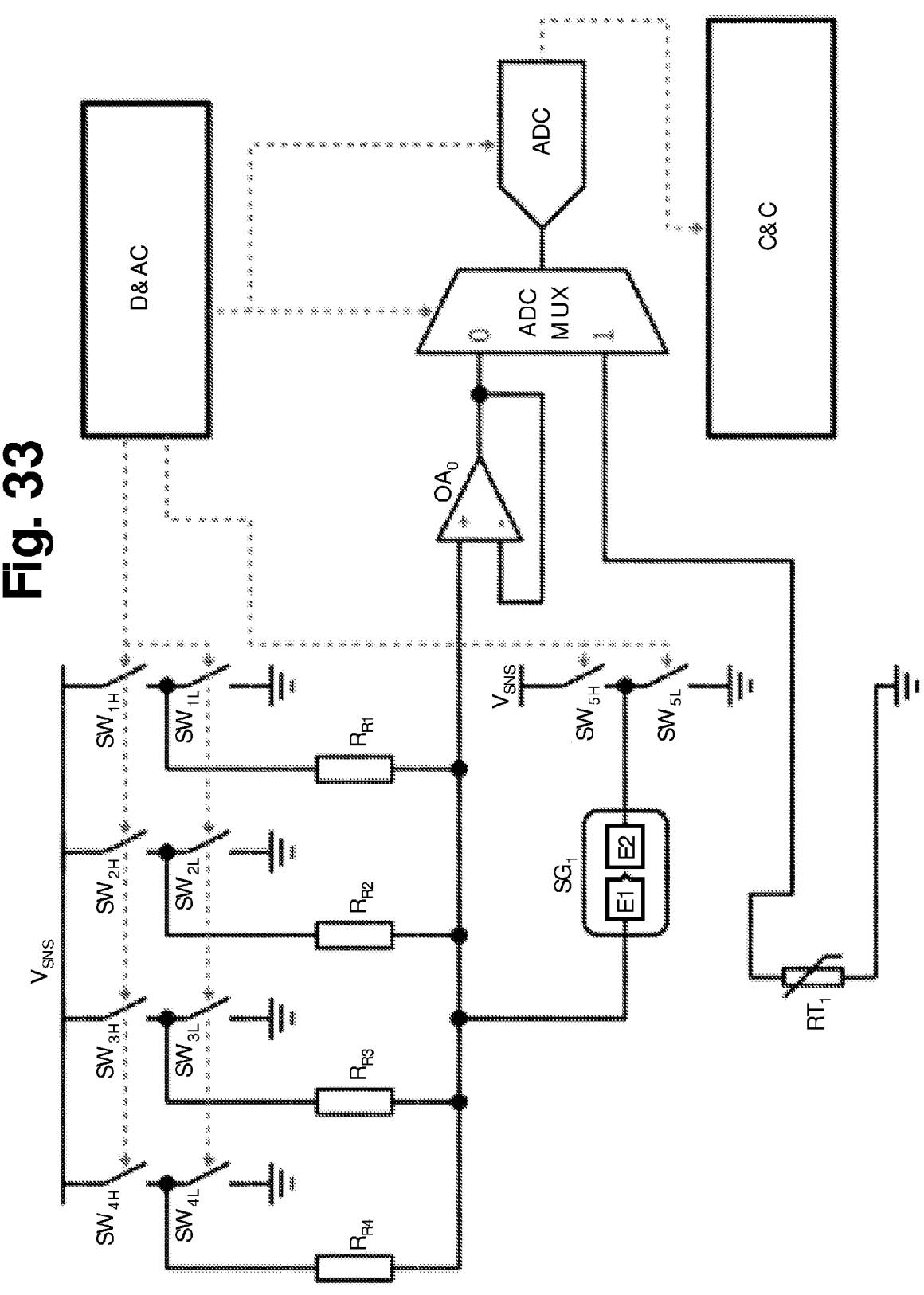

FIG. 33 shows a simplified scheme for a possible implementation that can be used for obtaining the sensor 10, based on the aforementioned resistive or proportional method with bipolar driving and with temperature detection for compensation purposes.

Also in this case the passive and protective components are omitted from the representation, which are in any case necessary for the correct operation of the circuit, and—given that the element $SG_1$ is similar to those previously described—the following fundamental elements are present:

with $RR_1$, $RR_2$, $RR_3$ and $RR_4$ reference resistors of the type indicated above are indicated, particularly with reference to FIG. 29, by means of which four voltage dividers are obtained operating on different measuring ranges, in order to optimize the accuracy of sensor 10;

with $RT_1$ a temperature detector is indicated, placed near the measuring electrodes E1-E2, used to carry out temperature compensation;

with $SW_{1H}$, $SW_{2H}$, $SW_{3H}$, $SW_{4H}$, $SW_{5H}$ and $SW_{1L}$, $SW_{2L}$, $SW_{3L}$, $SW_{4L}$, $SW_{5L}$ switches already described above are indicated, particularly with reference to FIG.

29, which can be obtained through corresponding GPIO outputs of a generic microcontroller, which can be configured at will;

with $V_{SNS}$ a generic source of constant voltage is indicated, for the driving of the sensor 10;

with $OA_0$ an operational amplifier is indicated, used as a voltage tracker in order to decouple the voltage divider from the measuring system, ensuring a very high input impedance; also in this case the operational amplifier $OA_0$ can possibly be used in amplifier configuration, inverting or non-inverting, in alternative circuit implementations;

with ADC a generic analog to digital converter is indicated;

with ADC MUX a generic multiplexer is indicated, placed between the inputs of the quantities to be acquired and the converter ADC;

with D&AC (Drive & Acquisition Control) a block, representing the control algorithm for the driving, the multiplexer ADC MUX and the converter ADC, is indicated;

with C&C (Computation & Communication) a block representing the compensation algorithm, the calculation of the measured value and the communication protocols.

The control algorithm of the switches $SW_{1H}$, $SW_{2H}$, $SW_{3H}$, $SW_{4H}$, $SW_{5H}$ and $SW_{1L}$, $SW_{2L}$, $SW_{3L}$, $SW_{4L}$, $SW_{5L}$ is similar to that described with reference to FIG. 33, in relation to the bipolar driving of the sensor 10. Also in this case the part previously indicated with V is here constituted by the operational amplifier $OA_0$, the multiplexer ADC MUX and the converter ADC.

In operation, also in this case, between two successive measurement cycles as described in relation to FIG. 29 (input 0 of the multiplexer) a temperature detection is carried out (input 1 of the multiplexer) through the detector $TR_1$, necessary to carry out the corresponding compensation as previously described, on the basis of the aforementioned polynomial, to the equivalent resistance measured.

In order to compensate, in addition to temperature variations, also the construction and assembly tolerances, the sensor according to the invention can be subjected to calibration. In the event that the sensor 10 provides for temperature detection, the calibration of the sensor, which can be carried out according to a technique known in itself, must be made before the calculation of the coefficients of the temperature compensation polynomial.

The acquisition system (which, as mentioned above includes the part of the circuit between the sensitive element $SG_1$, excluded, and the converter ADC) can be subjected to calibration using a reference sample resistor (therefore of a precisely known value), to be set in parallel to the capacitor $C_1$, at a predetermined and stable temperature, to determine the real value of capacitance in input to the acquisition system, through the measurement of the time constant RC of the circuit. The measured capacity value is then stored in a non-volatile memory inside the sensor 10 and used to carry out the appropriate correction to the measured values.

A calibration of the acquisition system can also be provided in the case of a sensor operating according to the resistive or proportional method (FIGS. 29-31 and 33).

The sensitive part $SG^1$, with its connections to the acquisition system, can also be calibrated. In this case, one or more measurements of the residual voltage level on the capacitor $C_1$ are made by means of a reference sample fluid, placed at a predetermined and stable temperature, and the variance with respect to the expected nominal value is determined. This information is stored in a non-volatile memory inside the sensor, and used to carry out the appropriate correction to the measured values.

A calibration of the sensitive part SG₁ can also be provided in the case of a sensor operating according to the resistive or proportional method (FIGS. 29-31 and 33).

Figure 37:
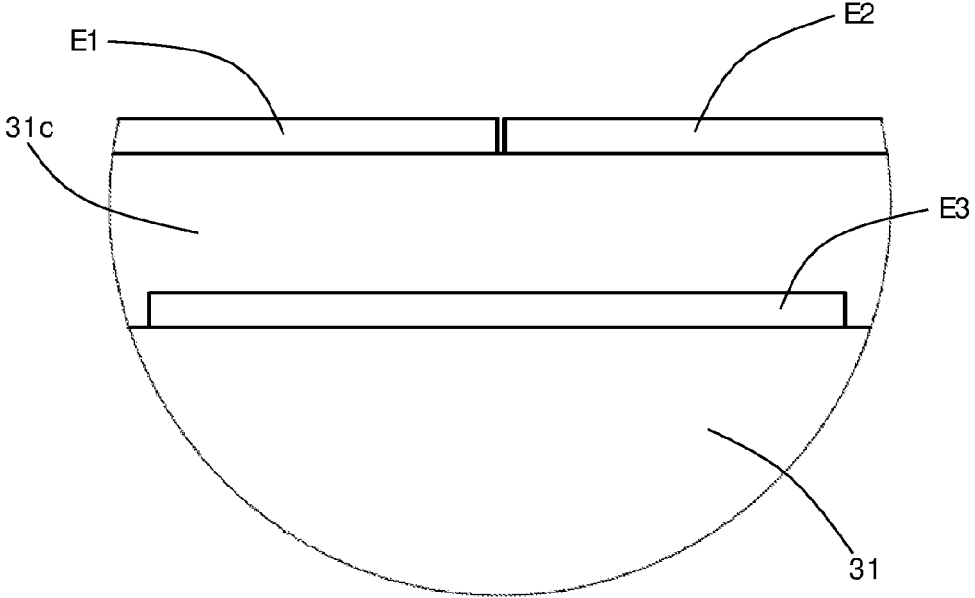
FIG. 37 is an enlarged view of the detail XXXVII of FIG. 35.

As previously indicated, the two electrodes E1 and E2 of a pair—or each pair—present in the sensitive part SG₁ can be operatively associated with a third electrode, performing source and gate functions, and the third electrode performing gate functions. As mentioned, if the sensitive part SG₁ includes a silicon wafer, the aforementioned third electrode can be obtained by appropriately doping a portion of said wafer. FIGS. 34-37 instead exemplify the case wherein, on the electrically insulating substrate 31 of a detection element 30, bearing a sensitive part SG₁ having electrodes E1 and E2 of the type already described, there is a third electrode, for example also made in the form of a thin film as already explained above, indicated with E3 in FIG. 36. As particularly visible in FIG. 37, the electrode E3, with a corresponding connection track E3*a*, can be obtained on the substrate 31, and then covered with a layer of dielectric material 31*c* on which the electrodes E1 and E2 are then arranged.

Figure 38:
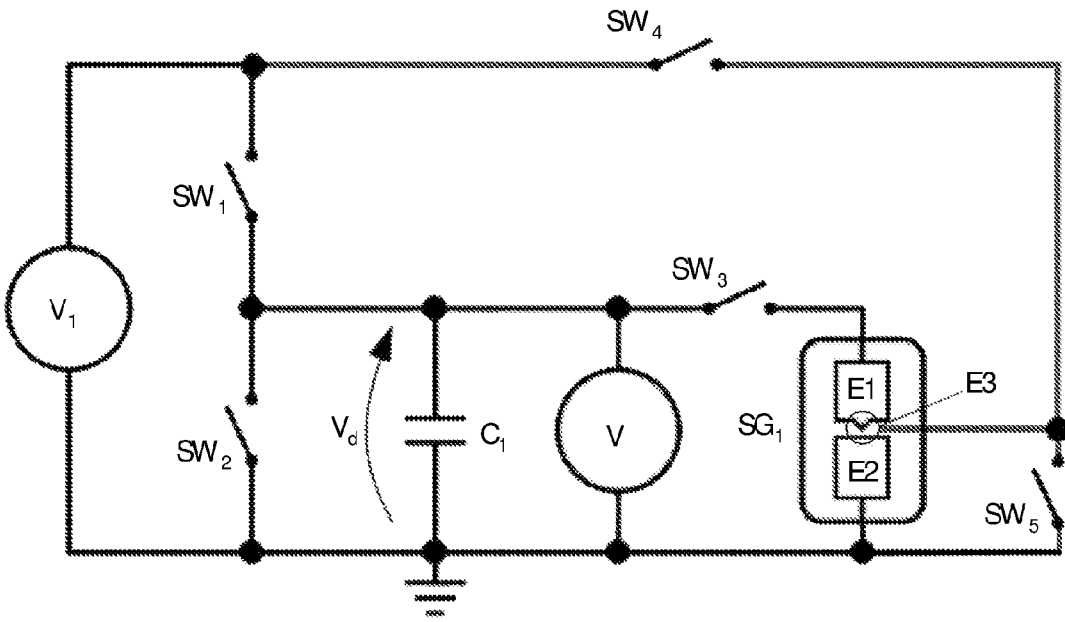
FIG. 38 exemplifies a possible circuit of a sensor device in accordance with other possible embodiments.

FIG. 38 exemplifies a possible circuit arrangement including the aforementioned third electrode E3. In the case exemplified, the circuit shown is—for simplicity—very similar to that of FIG. 27, that is, with the switches SW₁ and SW₂ that form a half-bridge structure, but the concepts are evidently also translatable to the other circuits described. Compared to FIG. 27, in FIG. 38 there are additional switches indicated with SW₄ and SW₅, and the related circuit branches, for driving the gate electrode E3.

With reference to the example in FIG. 38, it is possible to polarize the gate electrode E3 by closing the switch SW₄ switch the switches SW₁ and SW₅ open. Closing the switch SW₃ after having previously charged the capacitor C₁ leads to applying the voltage on the gap in the presence of the polarization of the gate electrode E3.

The characteristics of the present invention are clear from the given description, as are its advantages.

It is clear that numerous variants are possible for the person expert in the art to the sensor device described as an example, without departing from the scope of the invention as defined in the attached claims.

Reference has been made previously to the possible "indirect" use of the sensor 10 as a sensor of minimum level. Such use may be envisaged, for example, in applications where the electrical part of a generic device must always be at least partially immersed in a fluid having electrical insulation characteristics which are lower and clearly distinguishable from air, for example with an arrangement of the type shown in FIGS. 1-4 in relation to a battery. It will be appreciated that, in normal operation, with the sensitive part of the sensor 10 in contact with the fluid 5, the sensor itself will provide output information relating to a certain value of the dielectric strength of the fluid 5, which may be variable within certain limits (depending on the possible decay of the insulation characteristics), but which will always be clearly distinguishable from the value of dielectric rigidity of air.

On this basis, if the sensor 10 detects a dielectric strength value similar to that of air, it can be deduced that the level of the fluid 5 has fallen below the installation position of the sensor, to initiate any corrective actions, such as an alarm signal or the start of an automatic fluid top-up system.

The invention claimed is:

1. A sensor device for monitoring dielectric strength of a dielectric fluid, the sensor device having a sensor body which supports a sensitive part designed for contact with the dielectric fluid,
   wherein the sensitive part comprises an electrically insulating support having a support face, at least one pair of thin-film metal electrodes being fixedly disposed side-by-side on said support face in a fixed position relative to each other, the thin-film metal electrodes having respective peripheral profiles,
   wherein facing portions of the peripheral profiles are set at a predefined micrometric or sub-micrometric distance from one another, to define therebetween at least one detection gap through which part of the dielectric fluid is able to penetrate,
   and wherein the sensor device has a circuit arrangement which comprises:
      a driving circuit configured to generate an electric field between the facing portions of the peripheral profiles of the thin-film metal electrodes of the at least one pair of thin-film metal electrodes starting from a known or predefined supply voltage,
      a measuring circuit configured to measure a representative voltage indicative of a possible electric discharge between the facing portions of the peripheral profiles of the thin-film metal electrodes of the at least one pair of thin-film metal electrodes through the dielectric fluid present in the at least one detection gap, following generation of the electric field,
   wherein the facing portions of the peripheral profiles of the thin-film metal electrodes of the at least one pair of thin-film metal electrodes are spaced apart by a fixed distance between 100 nanometers and 20 micrometers, and
   wherein the circuit arrangement is configured to generate electric fields greater than 1 kV/mm between the facing portions of the peripheral profiles of the thin-film metal electrodes of the at least one pair of thin-film metal electrodes starting from a supply voltage lower than 50 V.

2. The sensor device according to claim 1, wherein said supply voltage is comprised between 1 and 30 V, or between 3 and 10 V.

3. The sensor device according to claim 1, wherein the circuit arrangement is configured for bipolar driving, or for enabling inversion of electric polarity of the thin-film metal electrodes of the at least one pair of thin-film metal electrodes between two successive detection cycles.

4. The sensor device according to claim 1, wherein the sensitive part comprises a plurality of pairs of thin-film metal electrodes fixedly disposed side-by-side on said support face in a fixed position relative to each other, wherein the facing portions of the peripheral profiles of the thin-film metal electrodes of each pair define a respective detection gap.

5. The sensor device according to claim 1, wherein:
   at least one thin-film metal electrode of the at least one pair of thin-film metal electrodes has a first portion of the respective peripheral profile with a generally pointed shape, that faces at the predefined distance a corresponding second portion of the peripheral profile of the other thin-film metal electrode of the at least one pair of thin-film metal electrodes, or
   at least one thin-film metal electrode of the at least one pair of thin-film metal electrodes has the peripheral profile thereof provided with at least one axially extended portion set at the predefined distance between two extended and parallel parts of a shaped portion of the peripheral profile of the other thin-film metal electrode of the at least one pair of thin-film metal electrodes, or the thin-film metal electrodes of the at least one pair of thin-film metal electrodes have the respective peripheral profiles each comprising a respective substantially comb-like portion, set in an interdigitated configuration at the predefined distance, said facing portions comprising the substantially comb-like portion of one of the thin-film metal electrodes of the at least one pair of thin-film metal electrodes, and the comb-like portion of the other one of the thin-film metal electrodes of the at least one pair of thin-film metal electrodes.

6. The sensor device according to claim 1, also comprising a temperature detector.

7. The sensor device according to claim 6, wherein the circuit arrangement is configured for applying a temperature-based correction to a measured value of the representative voltage as a function of a temperature detected by the temperature detector.

8. The sensor device according to claim 1, wherein the sensitive part comprises at least one third thin-film metal electrode operatively associated with the at least one pair of thin-film metal electrodes, and wherein the circuit arrangement is configured for using the thin-film metal electrodes of the at least one pair of thin-film metal electrodes as a source electrode and a drain electrode, respectively, and the third thin-film metal electrode as a gate electrode.

9. The sensor device according to claim 1, wherein the sensitive part comprises at least one from among:

a silicon oxide substrate on a silicon wafer, on the silicon oxide substrate there being set the at least one pair of thin-film metal electrodes;

an electrically insulating substrate bearing a third thin-film metal electrode operatively associated with the at least one pair of thin-film metal electrodes, on which a layer of dielectric material is set, on which there is in turn formed the at least one pair of thin-film metal electrodes.

10. The sensor device according to claim 1, wherein the sensor body comprises at least one body part that houses a detection element bearing the sensitive part, the at least one body part having one or more openings or passages to enable the dielectric fluid to reach into contact with the at least one pair of thin-film metal electrodes of the sensitive part.

11. The sensor device according to claim 10, wherein annular sealing means are set between a wall of the at least one body part and the detection element, in such a way that the annular sealing means delimit, together with respective portions of said wall and of the detection element, a detection chamber within which the one or more openings or passages open, and which the sensitive part carried by the detection element faces.

12. An electrical device having a casing which defines a containment volume within which an electrical part is arranged, the volume being adapted to receive a dielectric fluid, the electrical device comprising a sensor device according to claim 1, for the monitoring of the dielectric strength of the dielectric fluid.

13. The sensor device according to claim 1, wherein each thin-film metal electrode has a thickness between 50 nanometers and 2 micrometers or between 100 and 500 nanometers.

14. The sensor device according to claim 1, wherein the sensitive part comprises a silicon oxide substrate on a silicon wafer, on the silicon oxide substrate there being set the at least one pair of thin-film metal electrodes, the silicon wafer having a thickness not smaller than the predefined distance.

15. A sensor device for monitoring dielectric strength of a dielectric fluid, the sensor device having a sensor body which supports a sensitive part designed for contact with the dielectric fluid, wherein the sensitive part comprises at least one pair of electrodes having respective surface portions set at a predefined micrometric or sub-micrometric distance from one another, to define therebetween at least one detection gap through which part of the dielectric fluid is able to penetrate, wherein the sensor device has a circuit arrangement which comprises:

means for generating an electric field between the electrodes of the at least one pair of electrodes starting from a known or predefined supply voltage, and means for measuring a representative voltage representing possible occurrence of an electric discharge between the electrodes of the at least one pair of electrodes through the dielectric fluid present in the at least one detection gap, following upon generation of the electric field, and wherein the circuit arrangement comprises at least:

a voltage source to supply the known or predefined voltage, at least one capacitor having a known or predefined capacitance, controllable circuit means, for:

connecting and disconnecting the at least one capacitor with respect to the voltage source, connecting and disconnecting the at least one capacitor with respect to the electrodes of the at least one pair of electrodes, and measuring circuit means for measuring a value of the representative voltage across the at least one capacitor after the electric field has been generated, or after the capacitor has been disconnected with respect to the voltage source and connected with respect to the electrodes of the at least one pair of electrodes.

16. The sensor device according to claim 15, wherein the circuit arrangement is configured for bipolar driving, or for enabling inversion of electric polarity of the electrodes of the at least one pair of electrodes between two successive detection cycles.

17. A sensor device for monitoring dielectric strength of a dielectric fluid, the sensor device having a sensor body which supports a sensitive part designed for contact with the dielectric fluid, wherein the sensitive part comprises at least one pair of electrodes having respective surface portions set at a predefined micrometric or sub-micrometric distance from one another, to define therebetween at least one detection gap through which part of the dielectric fluid is able to penetrate, wherein the sensor device has a circuit arrangement which comprises:

means for generating an electric field between the electrodes of the at least one pair of electrodes starting from a known or predefined supply voltage, and means for measuring a representative voltage representing possible occurrence of an electric discharge between the electrodes of the at least one pair of electrodes through the dielectric fluid present in the at least one detection gap, following upon generation of the electric field, and wherein the circuit arrangement comprises:

a voltage source to supply the known or predefined voltage, a resistive voltage divider, comprising a plurality of reference resistors, controllable circuit means for selectively connecting and disconnecting the reference resistors between the voltage source and at least one electrode of the at least one pair of electrodes, measuring circuit means for measuring a value of the representative voltage across the terminals of the resistive voltage divider or between the electrodes of the at least one pair of electrodes after the electric field has been generated, or after each reference resistor has been connected between the voltage source and the at least one electrode of the at least one pair of electrodes.

18. The sensor device according to claim 17, wherein the circuit arrangement is configured for bipolar driving, or for enabling inversion of electric polarity of the electrodes of the at least one pair of electrodes between two successive detection cycles.

* * * * *